United States Patent
Shin et al.

(10) Patent No.: US 10,373,673 B2
(45) Date of Patent: Aug. 6, 2019

(54) SEMICONDUCTOR MEMORY DEVICE AND METHOD OF FABRICATING THE SAME

(71) Applicant: SAMSUNG ELECTRONICS CO., LTD., Suwon-si, Gyeonggi-do (KR)

(72) Inventors: JoongShik Shin, Yongin-si (KR); Byoungil Lee, Seoul (KR); Hyunmog Park, Seoul (KR); Euntaek Jung, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 24 days.

(21) Appl. No.: 15/614,714

(22) Filed: Jun. 6, 2017

(65) Prior Publication Data
US 2018/0068707 A1 Mar. 8, 2018

(30) Foreign Application Priority Data

Sep. 6, 2016 (KR) .......................... 10-2016-0114488

(51) Int. Cl.

| | |
|---|---|
| *H01L 29/76* | (2006.01) |
| *G11C 11/408* | (2006.01) |
| *G11C 8/08* | (2006.01) |
| *G11C 8/12* | (2006.01) |
| *G11C 11/06* | (2006.01) |
| *H01L 21/8239* | (2006.01) |

(Continued)

(52) U.S. Cl.
CPC .......... *G11C 11/4085* (2013.01); *G11C 8/08* (2013.01); *G11C 8/12* (2013.01); *G11C 8/14* (2013.01); *G11C 11/06042* (2013.01); *H01L 21/8239* (2013.01); *H01L 23/5286* (2013.01); *H01L 27/11565* (2013.01); *H01L 27/11573* (2013.01); *H01L 27/11575* (2013.01); *H01L 27/11582* (2013.01)

(58) Field of Classification Search
CPC ............. H01L 21/8239; H01L 23/5286; H01L 27/11565; H01L 27/11573; H01L 27/11575; H01L 27/11582; G11C 8/08; G11C 8/12; G11C 8/14; G11C 11/06042; G11C 11/4085
USPC ................................................ 257/314–321
See application file for complete search history.

(56) References Cited

U.S. PATENT DOCUMENTS

| | | |
|---|---|---|
| 7,521,333 B2 | 4/2009 | Choi et al. |
| 8,664,101 B2 | 3/2014 | Kim et al. |

(Continued)

FOREIGN PATENT DOCUMENTS

KR 10-2009-0122673 A 12/2009

*Primary Examiner* — Brook Kebede
(74) *Attorney, Agent, or Firm* — Lee & Morse, P.C.

(57) ABSTRACT

A semiconductor memory device includes a substrate, a ground selection line, a word line, an insulating layer, a vertical channel portion, and a first peripheral circuit gate pattern. The substrate includes a cell array region and a peripheral circuit region. The ground selection line is on the cell array region. The word line is on the ground selection line. The insulating layer is between the ground selection line and the word line. The vertical channel portion penetrates the ground selection line, word line, and insulating layer in a direction vertical to a top surface of the substrate. The first peripheral circuit gate pattern is on the peripheral circuit region of the substrate. The insulating layer extends from the cell array region onto the peripheral circuit region to cover a top surface of the first peripheral circuit gate pattern.

20 Claims, 22 Drawing Sheets

(51) Int. Cl.
*H01L 23/528* (2006.01)
*G11C 8/14* (2006.01)
*H01L 27/11565* (2017.01)
*H01L 27/11573* (2017.01)
*H01L 27/11575* (2017.01)
*H01L 27/11582* (2017.01)

(56) References Cited

U.S. PATENT DOCUMENTS

| | | |
|---|---|---|
| 8,730,727 B2 | 5/2014 | Yoo et al. |
| 8,735,967 B2 | 5/2014 | Lim et al. |
| 9,130,052 B2 | 9/2015 | Kim et al. |
| 9,130,053 B2 | 9/2015 | Kim et al. |
| 9,196,364 B2 | 11/2015 | Kim et al. |
| 9,299,716 B2 | 3/2016 | Hwang et al. |
| 2012/0108048 A1 | 5/2012 | Lim et al. |
| 2015/0372004 A1 | 12/2015 | Jung et al. |
| 2016/0027796 A1* | 1/2016 | Yang ............... H01L 27/11573 257/314 |
| 2017/0103993 A1* | 4/2017 | Lee ............... H01L 27/11565 |
| 2017/0148804 A1* | 5/2017 | Lee ............... H01L 27/11578 |

* cited by examiner

SEMICONDUCTOR MEMORY DEVICE AND METHOD OF FABRICATING THE SAME

CROSS-REFERENCE TO RELATED APPLICATION

Korean Patent Application No. 10-2016-0114488, filed on Sep. 6, 2016, and entitled: "Semiconductor Memory Device and Method of Fabricating the Same," is incorporated by reference herein in its entirety.

BACKGROUND

1. Field

One or more embodiments described herein relate to a semiconductor memory device and a method for fabricating a semiconductor memory device.

2. Description of the Related Art

The integration density of semiconductor memory devices directly affects manufacturing costs. The integration density of two-dimensional (2D) or planar semiconductor memory devices may be determined based on the areas of their unit memory cells. Therefore, the integration density of the 2D semiconductor memory devices may be greatly affected by the technique used to form fine patterns. However, the apparatuses used to form fine patterns are very expensive. Thus, three-dimensional (3D) semiconductor memory devices have been developed.

SUMMARY

In accordance with one or more embodiments, a semiconductor memory device includes a substrate including a cell array region and a peripheral circuit region; a ground selection line on the cell array region of the substrate; a word line on the ground selection line; an insulating layer between the ground selection line and the word line; a vertical channel portion penetrating the ground selection line, the word line, and the insulating layer in a direction vertical to a top surface of the substrate; and a first peripheral circuit gate pattern on the peripheral circuit region of the substrate, wherein the insulating layer extends from the cell array region onto the peripheral circuit region to cover a top surface of the first peripheral circuit gate pattern.

In accordance with one or more other embodiments, a semiconductor memory device includes a substrate including a cell array region, a peripheral circuit region, and a contact region between the cell array region and the peripheral circuit region; a first stack structure on the cell array region and the contact region of the substrate, the first stack structure extending in a first direction and including a first ground selection line, a first word line, and a first insulating portion between the first ground selection line and the first word line; a vertical channel portion penetrating the first stack structure on the cell array region in a direction vertical to a top surface of the substrate; a peripheral circuit gate pattern on the peripheral circuit region of the substrate, and a second insulating portion covering a top surface of the peripheral circuit gate pattern, wherein a top surface of the second insulating portion is lower than a top surface of the first word line, and wherein the first insulating portion extends onto the peripheral circuit region and is connected to the second insulating portion.

In accordance with one or more other embodiments, a semiconductor memory device includes a cell region; a peripheral circuit region; a plurality of word lines stacked in the cell region; and a first transistor in the peripheral circuit region, wherein a top layer of the first transistor is at a height equal to or lower than a lowermost one of the word lines.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
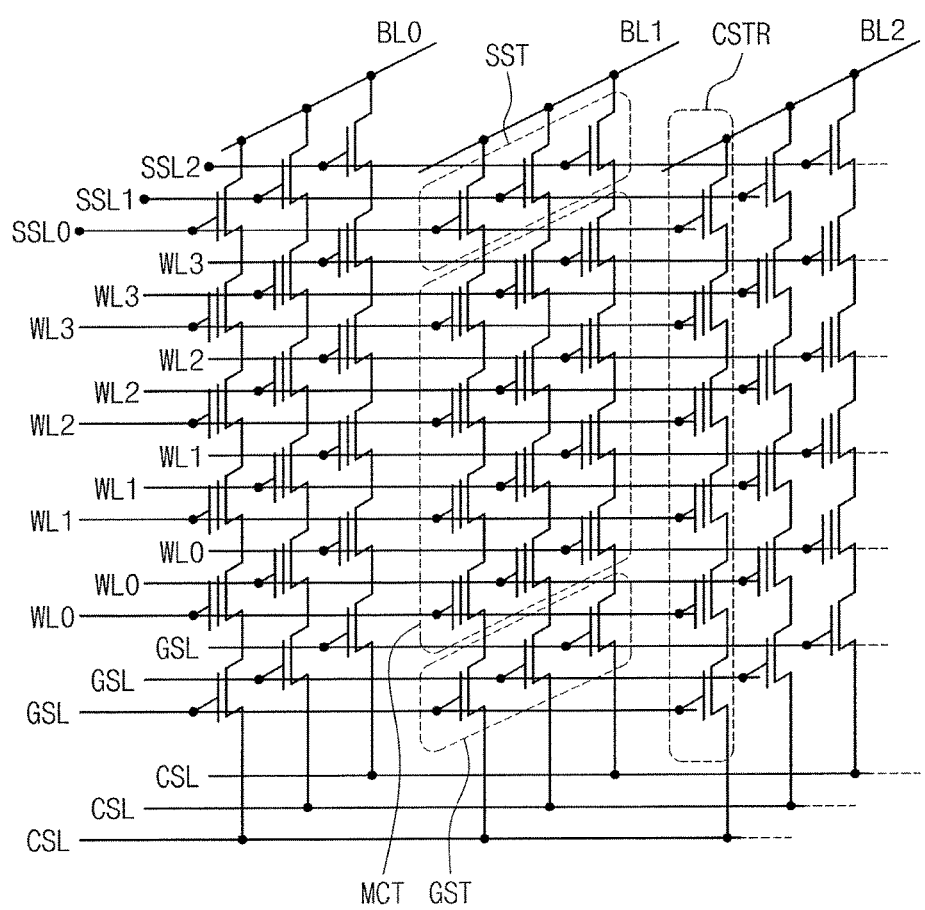
FIG. 1 illustrates an embodiment of a cell array of a semiconductor memory device.

FIG. 1 illustrates an embodiment of a cell array of a semiconductor memory device which may include a common source line CSL, a plurality of bit lines BL0 to BL2, and a plurality of cell strings CSTR disposed between the common source line CSL and the bit lines BL0 to BL2. The bit lines BL0 to BL2 may be two-dimensionally arranged. A plurality of the cell strings CSTR may be connected in parallel to each of the bit lines BL0 to BL2. Thus, the cell strings CSTR may be two-dimensionally arranged, for example, on the common source line CSL or a substrate.

Each of the cell strings CSTR may include a ground selection transistor GST connected to the common source line CSL, a string selection transistor SST connected to one of the bit lines BL0 to BL2, and a plurality of memory cell transistors MCT between the ground and string selection transistors GST and SST. The ground selection transistor GST, the memory cell transistors MCT, and the string selection transistor SST may be connected in series to each other in the order named. Ground selection lines GSL, a plurality of word lines WL0 to WL3, and string selection lines SSL0 to SSL2, which are between the common source lines CSL and the bit lines BL0 to BL2, may be used as gate electrodes of the ground selection transistors GST, gate electrodes of the memory cell transistors MCT, and gate electrodes of string selection transistors SST, respectively.

Since one cell string CSTR includes the memory cell transistors MCT respectively located at different levels from the common source line CSL, the word lines WL0 to WL3 respectively located at different levels may be between the common source line CSL and the bit lines BL0 to BL2. The ground and string selection transistors GST and SST and the memory cell transistors MCT may be metal-oxide-semiconductor (MOS) field effect transistors using a channel structure as channel regions.

Figure 2:
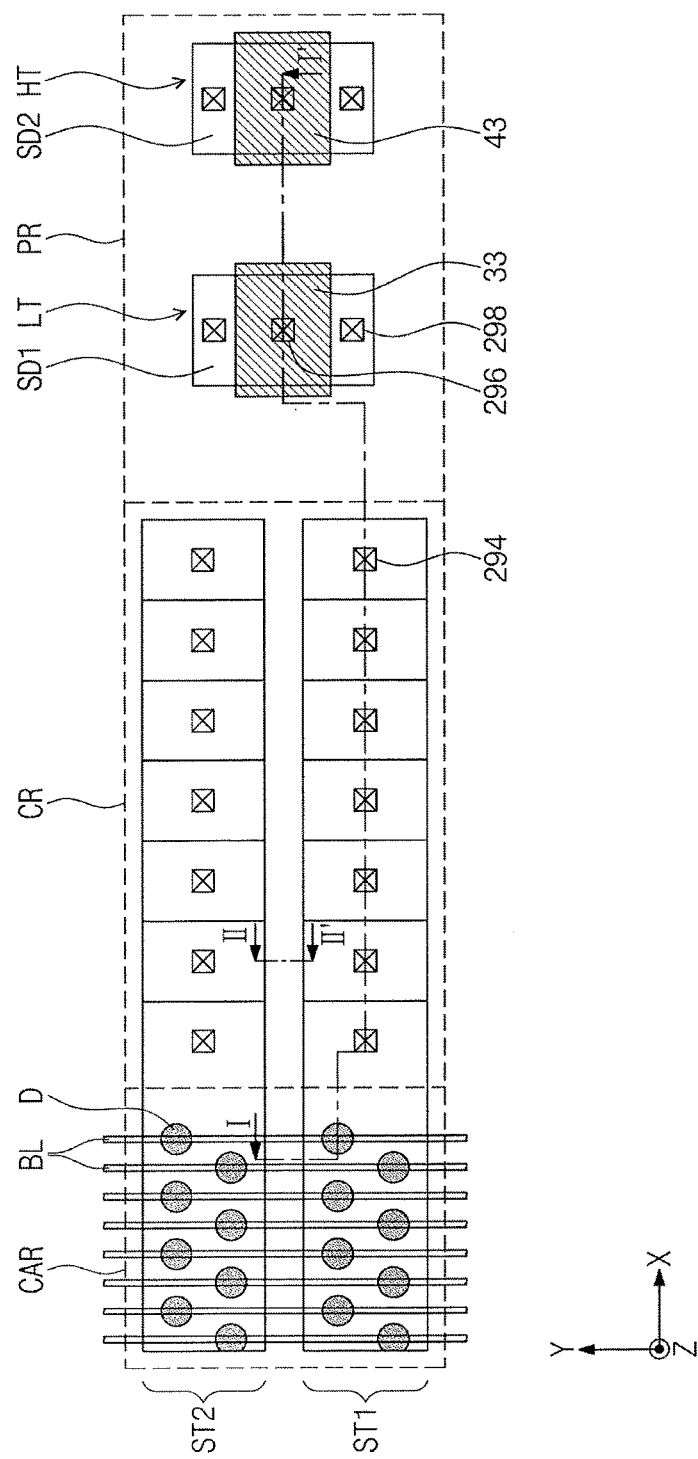
FIG. 2 illustrates a plan view of an embodiment of a semiconductor memory device.
Figure 3:
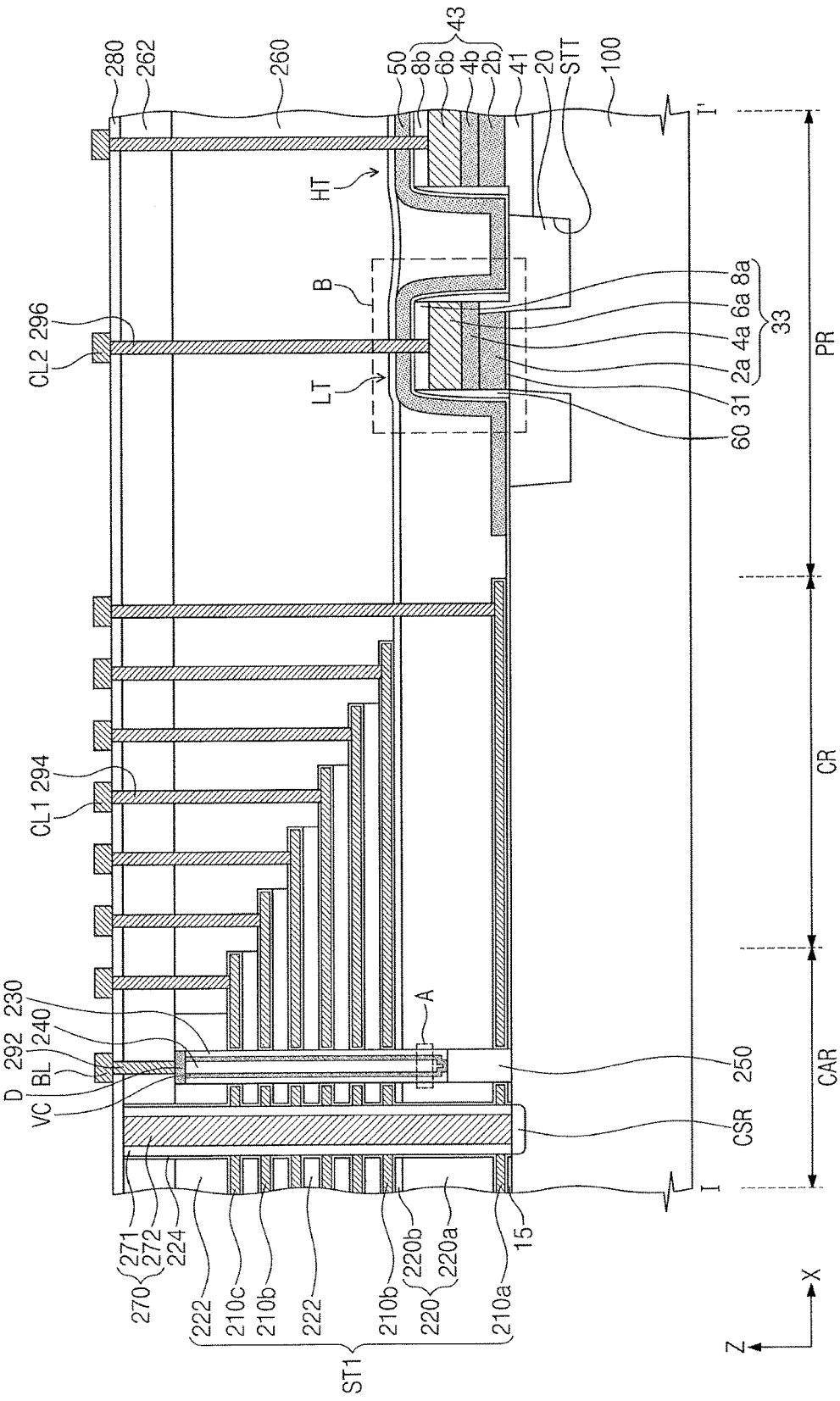
FIG. 3 illustrates a cross-sectional view taken along a line I-I' in FIG. 2.
Figure 4A:
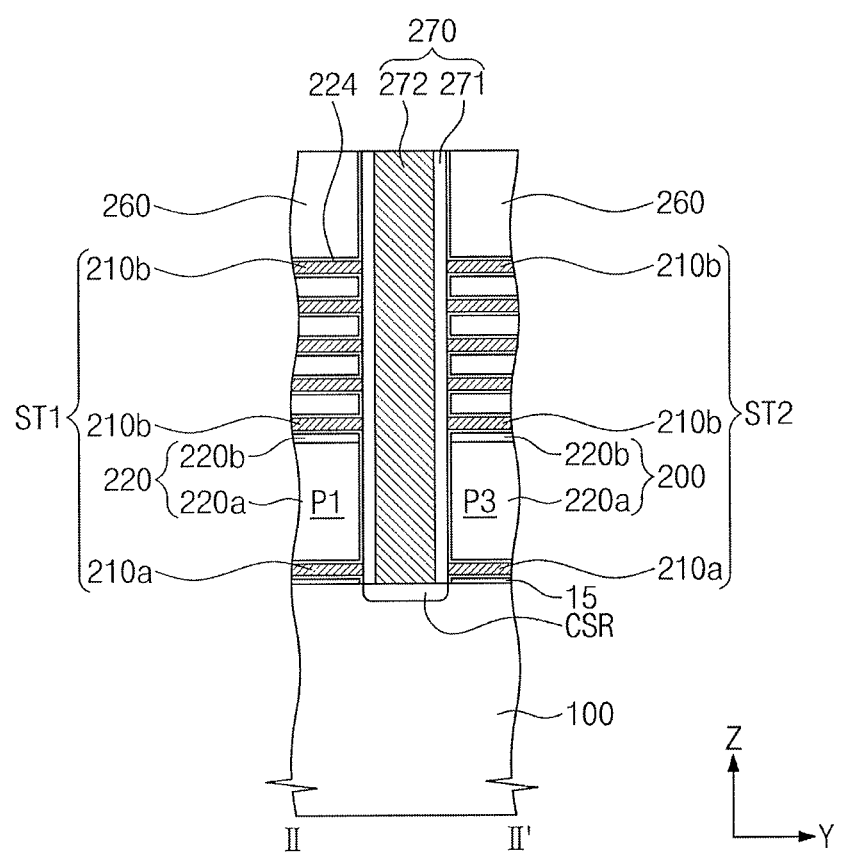
FIG. 4A illustrates a cross-sectional view taken along a line II-II' in FIG. 2.
Figure 4B:
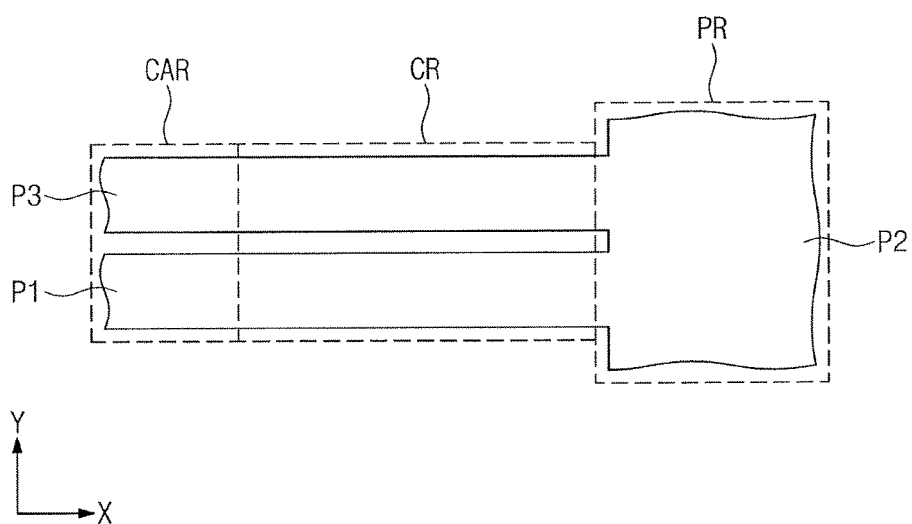
FIG. 4B illustrates a plan view of an embodiment of an insulating layer.
Figure 5:
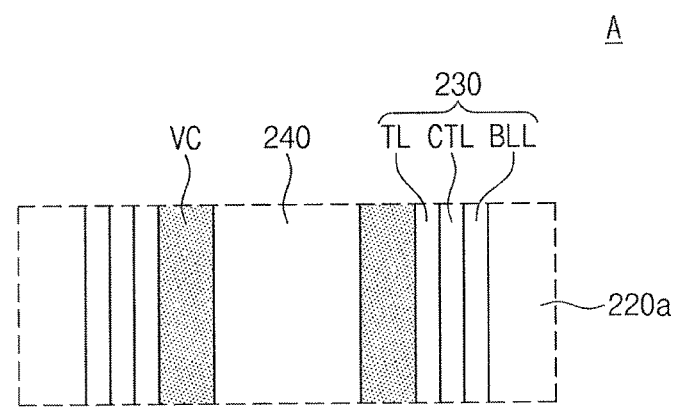
FIG. 5 illustrates an enlarged view of a portion 'A' in FIG. 3.
Figure 6:
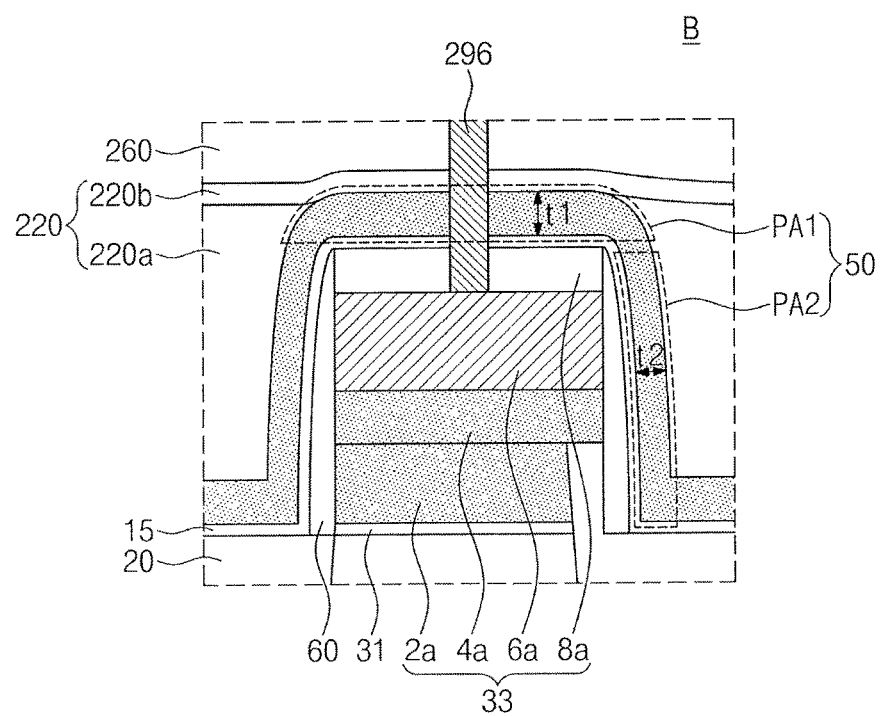
FIG. 6 illustrates an enlarged view of a portion 'B' in FIG. 3.

FIG. 2 is a plan view illustrating an embodiment of a semiconductor memory device. FIG. 3 is a cross-sectional view taken along a line I-I' in FIG. 2. FIG. 4A is a cross-sectional view taken along line II-II' in FIG. 2, and FIG. 4B is a plan view illustrating an embodiment of an insulating layer. FIG. 5 is an enlarged view of a portion 'A' in FIG. 3. FIG. 6 is an enlarged view of a portion in FIG. 3.

Referring to FIGS. 2 and 3, a substrate 100 may include a cell array region CAR, a peripheral circuit region PR, and a contact region CR between the cell array region CAR and the peripheral circuit region PR. In some embodiments, the contact region CR may surround the cell array region CAR when viewed from a plan view. The substrate 100 may be or include, for example, a silicon substrate, a silicon-germanium substrate, a germanium substrate, or a single-crystalline epitaxial layer grown on a single-crystalline silicon substrate.

A high-voltage transistor HT and a low-voltage transistor LT may be on the peripheral circuit region PR of the substrate 100. The high-voltage transistor HT and the low-voltage transistor LT may be on active regions defined by a device isolation layer 20 in a device isolation trench STT of the peripheral circuit region PR of the substrate 100.

The low-voltage transistor LT may include a low-voltage gate insulating pattern 31, a low-voltage gate pattern 33, and low-voltage source/drain regions SD1. The low-voltage gate insulating pattern 31 may be on the substrate 100. The low-voltage gate pattern 33 may be on the low-voltage gate insulating pattern 31. The low-voltage gate pattern 33 may include a first poly-silicon pattern 2a, a second poly-silicon pattern 4a, a metal pattern 6a, and a capping pattern 8a sequentially stacked on the low-voltage gate insulating pattern 31. The low-voltage source/drain regions SD1 may be in the active region of the substrate 100 at different sides of the low-voltage gate pattern 33.

The high-voltage transistor HT may include a high-voltage gate insulating pattern 41, a high-voltage gate pattern 43, and high-voltage source/drain regions SD2. The thickness of the high-voltage gate insulating pattern 41 may be greater than the thickness of the low-voltage gate insulating pattern 31. At least a portion of the high-voltage gate insulating pattern 41 may be in the substrate 100. For example, the bottom surface of the high-voltage gate insulating pattern 41 may be at a lower level than the top surface of the substrate 100 of the cell array region CAR and the contact region CR. The top surface of the high-voltage gate insulating pattern 41 may be at a higher level than the top surface of the substrate 100 of the cell array region CAR and the contact region CR. The bottom surface of the high-voltage gate insulating pattern 41 may be at a lower level than a bottom surface of the low-voltage gate insulating pattern 31. The top surface of the high-voltage gate insulating pattern 41 may be at the substantially same level as the top surface of the low-voltage gate insulating pattern 31.

The high-voltage gate pattern 43 may include a first poly-silicon pattern 2b, a second poly-silicon pattern 4b, a metal pattern 6b, and a capping pattern 8b sequentially stacked on the high-voltage gate insulating pattern 41. The high-voltage source/drain regions SD2 may be in the active region of the substrate 100 at different sides of the high-voltage gate pattern 43.

Spacers 60 may be on sidewalls of the low-voltage gate pattern 33 and sidewalls of the high-voltage gate pattern 43.

First and second stack structures ST1 and ST2 may be on the cell array region CAR and the contact region CR of the substrate 100. The first and second stack structures ST1 and ST2 may extend in a first direction X and may be spaced apart from each other on the substrate 100 in a second direction Y, which intersects the first direction X. A cell dopant region CSR may be in the substrate 100 between the first and second stack structures ST1 and ST2. The cell dopant region CSR may extend in the first direction X. The cell dopant region CSR may be the common source line CSL described, for example, with reference to FIG. 1. In this case, the cell dopant region CSR may have a different conductivity type from the substrate 100.

Each of the first and second stack structures ST1 and ST2 may include gate electrodes 210a, 210b, and 210c, insulating patterns 222, and an insulating layer 220. The gate electrodes 210a, 210b, and 210c may be stacked in a third direction Z perpendicular to the top surface of the substrate 100. The gate electrodes 210a, 210b, and 210c may extend in the first direction X. Lengths of the gate electrodes 210a, 210b, and 210c in the first direction X may be different from each other. For example, the lengths of the gate electrodes 210a, 210b, and 210c may decrease sequentially as a vertical distance from the substrate 100 increases. Thus, the length of the lowermost gate electrode in the first direction X may be the greatest one of the lengths of the gate electrodes 210a, 210b, and 210c. The length of the uppermost gate electrode in the first direction X may be the smallest of the lengths of gate electrodes 210a, 210b, and 210c.

The gate electrodes 210a, 210b, and 210c may include a ground selection gate electrode 210a, a string selection gate electrode 210c, and cell gate electrodes 210b between the ground selection gate electrode 210a and the string selection gate electrode 210c. In some embodiments, the top surfaces of the low-voltage and high-voltage gate patterns 33 and 43 may be at a level between the ground selection gate electrode 210a and the lowermost cell gate electrode 210b. The ground selection gate electrode 210a may correspond to the lowermost gate electrode. The string selection gate electrode 210c may correspond to the uppermost gate electrode. The ground selection gate electrode 210a may be the ground selection line GSL in FIG. 1, the cell gate electrodes 210b may be the word lines WL in FIG. 1, and the string selection gate electrode 210c may be the string selection line SSL in FIG. 1.

The insulating patterns 222 may be between the cell gate electrodes 210b, between the uppermost cell gate electrode 210b and the string selection gate electrode 210c, and on the string selection gate electrode 210c. The length of each insulating pattern 222 in the first direction X may be substantially equal to the length, in the first direction X, of the gate electrode disposed directly on each insulating pattern 222. On the contact region CR of the substrate 100, an end portion of each of the cell and string selection gate electrodes 210b and 210c may be exposed by the insulating pattern 222 disposed directly thereon. For example, end portions of the first and second stack structures ST1 and ST2 may have staircase structures on the contact region CR of the substrate 100.

The insulating layer 220 may be between the ground selection gate electrode 210a and the lowermost cell gate electrode 210b. The insulating layer 220 may extend onto the low-voltage gate pattern 33 and the high-voltage gate pattern 43 of the peripheral circuit region PR. The top surface of the insulating layer 220 on the cell array region CAR and the contact region CR may be at a lower level than or the substantially same level as a top surface of the insulating layer 220 on the peripheral circuit region PR. The top surface of the insulating layer 220 on the peripheral circuit region PR may be at a lower level than a top surface of the lowermost cell gate electrode 210b. The insulating layer 220 may include a first insulating layer 220a and a second insulating layer 220b. The second insulating layer 220b may be between the lowermost cell gate electrode 210b and the first insulating layer 220a. The thickness of the first insulating layer 220a may be greater than a thickness of the second insulating layer 220b. For example, each of the first and second insulating layers 220a and 220b may include a high-density plasma (HDP) oxide layer.

In one embodiment, the insulating layer 220 may include a first insulating portion P1, a second insulating portion P2, and a third insulating portion P3 as illustrated in FIGS. 4A and 4B. The second insulating portion P2 may be on the peripheral circuit region PR of the substrate 100 and may cover the low-voltage and high-voltage gate patterns 33 and 43. The first insulating portion P1 may be between the ground selection gate electrode 210a of the first stack structure ST1 and the lowermost cell gate electrode 210b of the first stack structure ST1. The first insulating portion P1 may extend onto the peripheral circuit region PR so as to be connected to the second insulating portion P2. The third insulating portion P3 may be between the ground selection gate electrode 210a of the second stack structure ST2 and the lowermost cell gate electrode 210b of the second stack structure ST2. The third insulating portion P3 may extend onto the peripheral circuit region PR and be connected to the second insulating portion P2.

Vertical channel portions VC may penetrate the first and second stack structures ST1 and ST2. The vertical channel portions VC penetrating each of the first and second stack structures ST1 and ST2 may be arranged in a predetermined manner (e.g., a line or in a zigzag form) along the second direction Y. Each of the vertical channel portions VC may have, for example, a hollow pipe shape, a cylindrical shape, or a cup shape. The vertical channel portions VC may include a semiconductor material. For example, the vertical channel portions VC may include at least one of a polycrystalline silicon layer, an organic semiconductor layer, or a carbon nano-structure.

Charge storage structures 230 may be between the vertical channel portions VC and the stack structures ST1 and ST2. For example, each of the charge storage structures 230 may be between the vertical channel portion VC and the cell gate electrodes 210b and between the vertical channel portion VC and the string selection gate electrode 210c. Each of the charge storage structures 230 may extend along a sidewall of the vertical channel portion VC in the third direction Z. At least a portion of the charge storage structure 230 may surround an outer sidewall of the vertical channel portion VC.

Referring to FIG. 5, each of the charge storage structures 230 may include a tunnel insulating layer TL, a blocking insulating layer BLL, and a charge storage layer CTL between the tunnel insulating layer IL and the blocking insulating layer BLL. The tunnel insulating layer TL may be adjacent to the vertical channel portion VC and may surround the outer sidewall of the vertical channel portion VC. The blocking insulating layer BLL may be adjacent to the gate electrodes 210a, 210b, and 210c. The charge storage structure 230 may be a single layer or multi-layer including at least one of a silicon oxide layer, a silicon nitride layer, a silicon oxynitride layer, or a high-k dielectric layer. In some embodiments, the blocking insulating layer BLL may include a silicon oxide layer or a high-k dielectric layer (e.g., aluminum oxide ($Al_2O_3$) or hafnium oxide ($HfO_2$)). The charge storage layer CTL may include a silicon nitride layer. The tunnel insulating layer TL may include a silicon oxide layer or a high-k dielectric layer (e.g., aluminum oxide ($Al_2O_3$) or hafnium oxide ($HfO_2$)).

A gap-fill layer 240 may be in an inner space surrounded by each of the vertical channel portions VC. The gap-fill layer 240 may include an insulating material, e.g., silicon oxide, silicon nitride, or silicon oxynitride. Pads D may be on the vertical channel portions VC, the charge storage structures 230, and the gap-fill layers 240. The pads D may be electrically connected to the vertical channel portions VC. The pads D may include a conductive material or a semiconductor material doped with dopants having a conductivity type is different from that of the vertical channel portions VC.

Semiconductor pillars 250 may be between the substrate 100 and the vertical channel portions VC, respectively. The semiconductor pillars 250 may be on the top surface of the substrate 100 and may penetrate the ground selection gate electrode 210a. The vertical channel portions VC may be electrically connected to the semiconductor pillars 250. The semiconductor pillars 250 may include a semiconductor material having the same conductivity type as the substrate 100 or may include an intrinsic semiconductor material. For example, the semiconductor pillars 250 may include a single-crystalline intrinsic semiconductor material or a P-type semiconductor material.

A horizontal insulating layer 224 may be between charge storage structure 230 and gate electrodes 210a, 210b, and 210c and may extend onto top surfaces and bottom surfaces of gate electrodes 210a, 210b, and 210c. For example, horizontal insulating layer 224 may include at least one of a silicon oxide layer (e.g., $SiO_2$) or a high-k dielectric layer (e.g., aluminum oxide ($Al_2O_3$) layer or hafnium oxide ($HfO_2$) layer).

A blocking pattern 50 may be on the peripheral circuit region PR of the substrate 100. The blocking pattern 50 may be between the substrate 100 and the insulating layer 220. In addition, the blocking pattern 50 may extend between the insulating layer 220 and the sidewalls of the low-voltage gate pattern 33, between the insulating layer 220 and the top surface of the low-voltage gate pattern 33, between the insulating layer 220 and the sidewalls of the high-voltage gate pattern 43, and between the insulating layer 220 and the top surface of the high-voltage gate pattern 43. The blocking pattern 50 may be in contact with the insulating layer 220. A portion of the insulating layer 220 may fill a space between the blocking pattern 50 and the ground selection gate electrode 210a. The blocking pattern 50 may include a different insulating material from the insulating layer 220. For example, the blocking pattern 50 may include a silicon nitride layer.

Referring to FIG. 6, the blocking pattern 50 may include first portions PA1 and second portions PA2. The first portions PA1 may be on the top surfaces of the low-voltage and high-voltage gate patterns 33 and 43. The second portions PA2 may be on the sidewalls of the low-voltage and high-voltage gate patterns 33 and 43. The blocking pattern 50 may be formed by a deposition process having poor step coverage properties. Thus, the thicknesses of the first portions PA1 may be different from thicknesses of the second portions PA2. For example, the minimum thicknesses t1 of the first portions PA1 may be greater than the minimum thicknesses t2 of the second portions PA2.

A buffer layer 15 may be between the substrate 100 and the ground selection gate electrode 210a. The buffer layer 15 may extend between the substrate 100 and the insulating layer 220, between the substrate 100 and the blocking pattern 50, between the blocking pattern 50 and the spacers 60, between the blocking pattern 50 and the top surface of the low-voltage gate pattern 33, and between the blocking pattern 50 and the top surface of the high-voltage gate pattern 43. In some embodiments, the insulating layer 220 may be in contact with a top surface of the buffer layer 15 disposed between the ground selection gate electrode 210a and the blocking pattern 50. The buffer layer 15 may include, for example, a silicon oxide layer or a thermal oxide layer.

An interlayer insulating pattern 260 may be on the contact region CR and the peripheral circuit region PR of the substrate 100. The interlayer insulating pattern 260 may be on the top surface of the insulating layer 220 and the end portions of the cell and string selection gate electrodes 210b and 210c on the contact region CR of the substrate 100. A top surface of the interlayer insulating pattern 260 may be at the same level as a top surface of the uppermost one of the insulating patterns 222. Interlayer insulating pattern 260 may include, for example, a tetraethyl orthosilicate (TEOS) oxide layer.

A first interlayer insulating layer 262 may be on the interlayer insulating pattern 260 and the first and second stack structures ST1 and ST2. The first interlayer insulating layer 262 may be on the top surface of the interlayer insulating pattern 260 and the top surface of the uppermost insulating pattern 222. The first interlayer insulating layer 262 may include, for example, a silicon oxide layer.

A contact structure 270 may be between the first stack structure ST1 and the second stack structure ST2. The contact structure 270 may include a spacer 271 and a common source contact 272. The common source contact 272 may be electrically connected to the cell dopant region CSR in the substrate 100. The common source contact 272 may include, for example, at least one of a metal material (e.g., tungsten, copper, or aluminum) or a transition metal material (e.g., titanium or tantalum). The spacer 271 may surround an outer sidewall of the common source contact 272. The spacer 271 may include, for example, an insulating material (e.g., a silicon oxide layer or a silicon nitride layer).

In some embodiments, the contact structure 270 may extend along the cell dopant region CSR in the first direction X and may be electrically connected to the cell dopant region CSR. The contact structure 270 may extend in the third direction Z and may penetrate the first interlayer insulating layer 262. The contact structure 270 may have, for example, a rectangular shape or linear shape extending in the first direction X when viewed from a plan view. In certain embodiments, a plurality of contact structures 270 may be provided and arranged along the cell dopant region CSR in the first direction X. In this case, the contact structure 270 may have, for example, a pillar shape.

A second interlayer insulating layer 280 may be on the first interlayer insulating layer 262 and the contact structure 270. The second interlayer insulating layer 280 may include, for example, a silicon oxide layer.

Bit line contact plugs 292 may be on the pads D, respectively. The bit line contact plugs 292 may penetrate the second and first interlayer insulating layers 280 and 262. The bit line contact plugs 292 may be electrically connected to the pads D and the vertical channel portions VC. Cell contact plugs 294 may be on the end portions of the gate electrodes 210a, 210b, and 210c, respectively. The cell contact plugs 294 may be on the contact region CR of the substrate 100. The cell contact plugs 294 may be electrically connected to the gate electrodes 210a, 210b, and 210c, respectively. Gate contact plugs 296 may be on the low-voltage gate pattern 33 and the high-voltage gate pattern 43, respectively. The gate contact plugs 296 may be electrically connected to the low-voltage gate pattern 33 and high-voltage gate pattern 43, respectively. Source/drain contact plugs 298 may be on the low-voltage and high-voltage source/drain regions SD1 and SD2 and may be electrically connected to the low-voltage and high-voltage source/drain regions SD1 and SD2.

Bit lines BL, first interconnection lines CL1, and second interconnection lines CL2 may be on the second interlayer insulating layer 280. The bit lines BL may be electrically connected to the bit line contact plugs 292 and may extend in the second direction Y. The bit lines BL may intersect the first and second stack structures ST1 and ST2. The first interconnection lines CL1 may be electrically connected to the cell contact plugs 294. The second interconnection lines CL2 may be electrically connected to the gate contact plugs 296.

Figure 7:
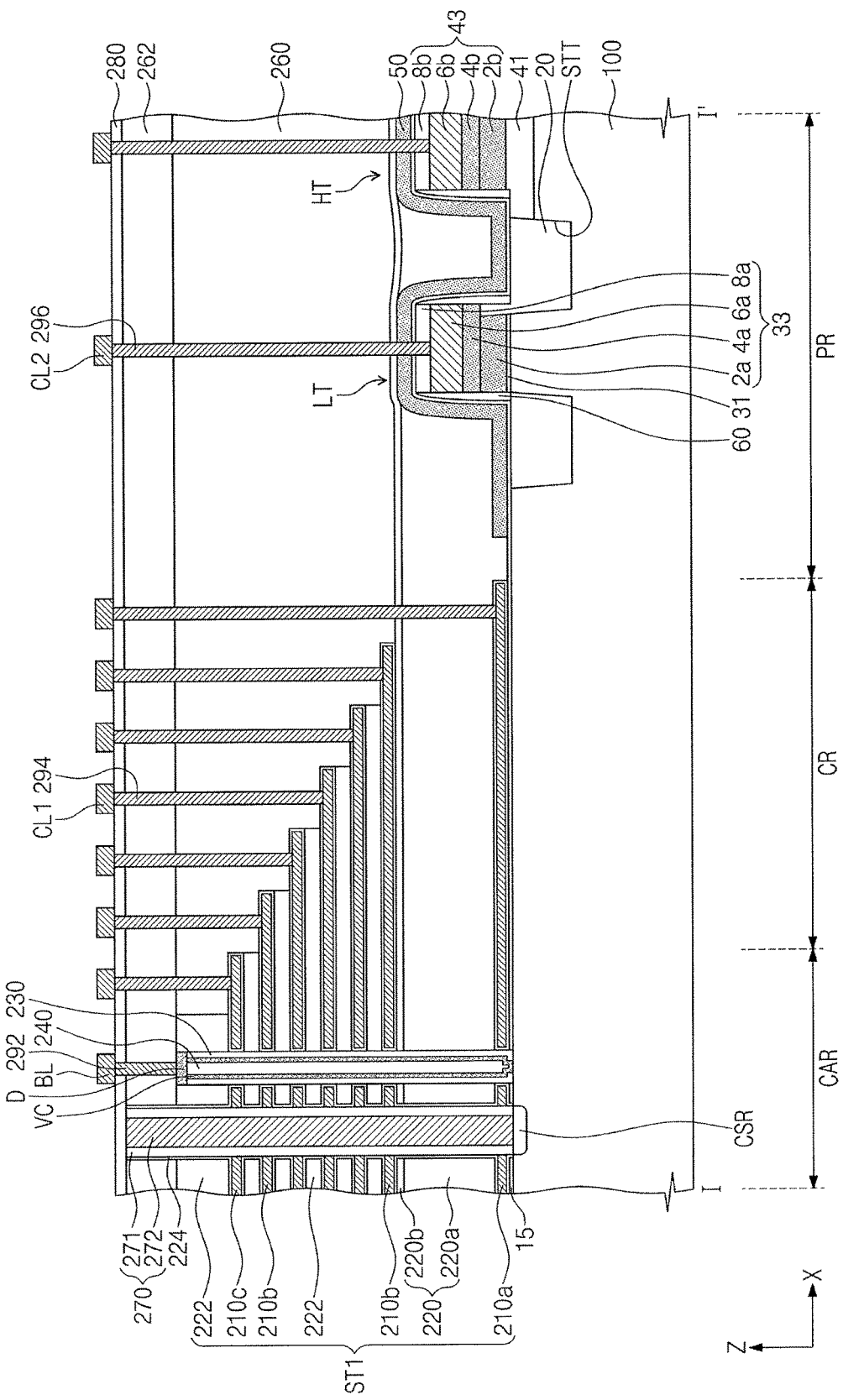
FIG. 7 illustrates a cross-sectional view of another embodiment taken along a line I-I' in FIG. 2.

FIG. 7 illustrates a cross-sectional view of another embodiment taken along a line I-I' in FIG. 2. Referring to FIG. 7, the vertical channel portions VC and the charge storage structures 230 may further penetrate the ground selection gate electrode 210a and the buffer layer 15 in order to be in contact with the substrate 100. Thus, semiconductor pillar 250 in FIG. 3 may be omitted the embodiment of FIG. 7.

Figure 8:
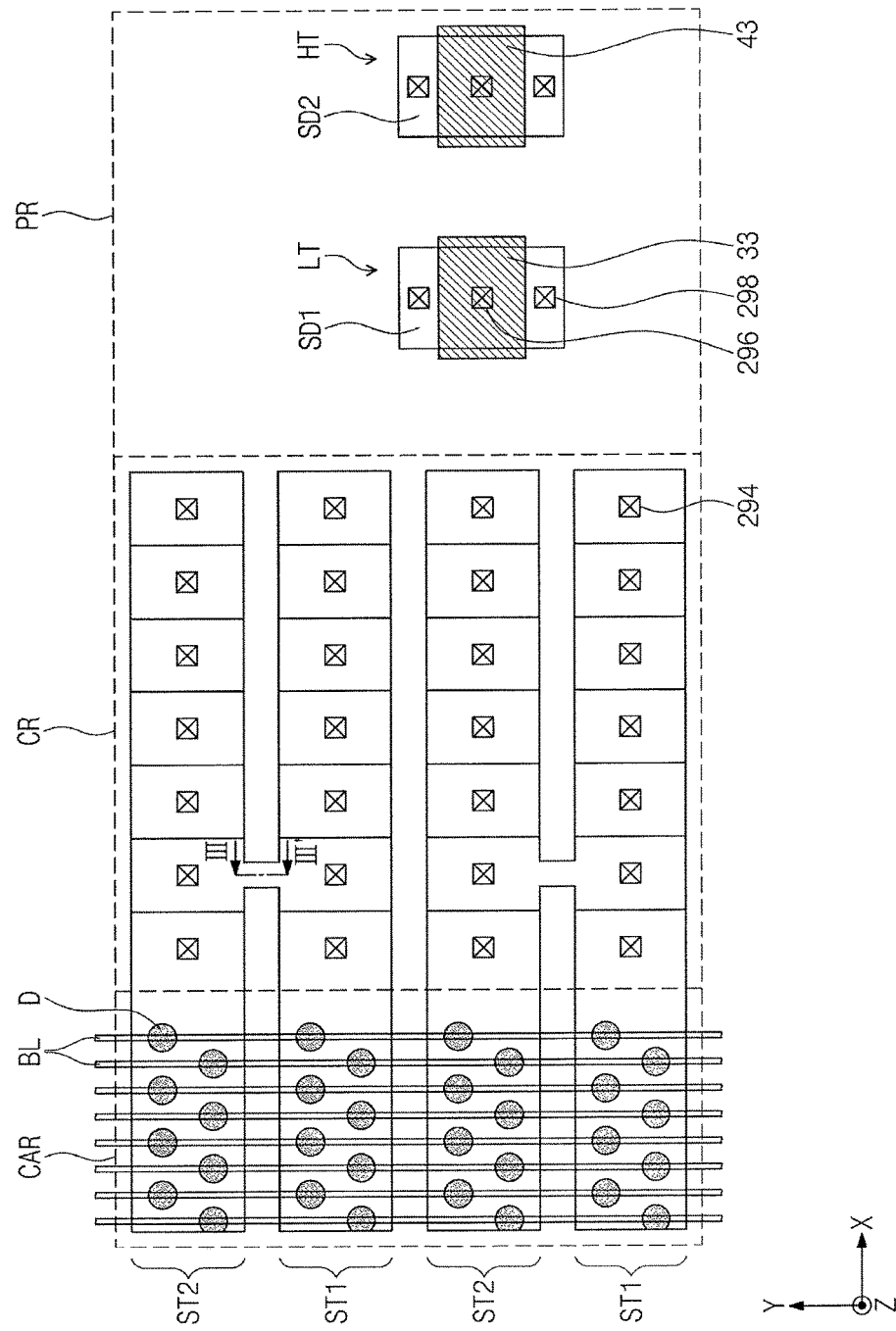
FIG. 8 illustrates another embodiment of a semiconductor memory device.
Figure 9A:
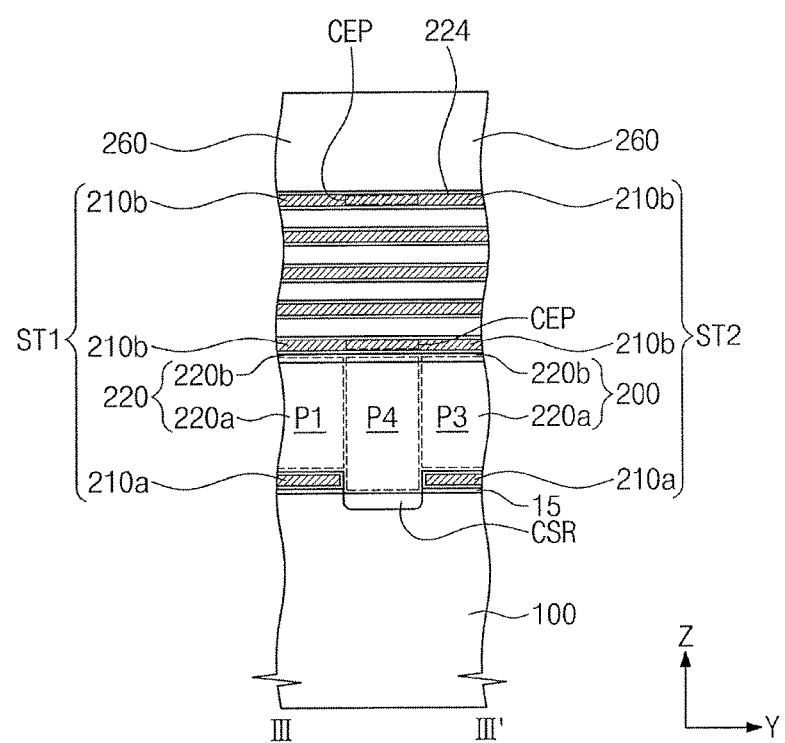
FIG. 9A illustrates a cross-sectional view taken along a line in FIG. 8.

FIG. 8 is a plan view illustrating another embodiment of a semiconductor memory device. FIG. 9A is a cross-sectional view taken along a line in FIG. 8, and FIG. 9B is a plan view illustrating an embodiment of an insulating layer 220.

Figure 9B:
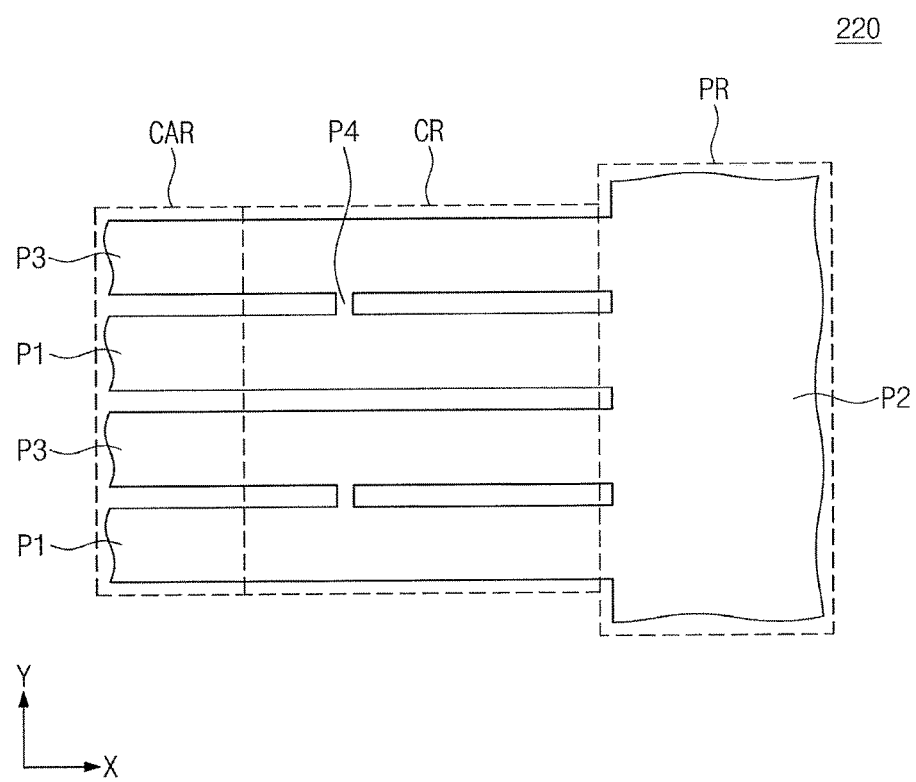
FIG. 9B illustrates an embodiment which includes an insulating layer.

Referring to FIGS. 8, 9A, and 9B, an insulating layer 220 may include a first insulating portion P1, a second insulating portion P2, a third insulating portion P3, and a fourth insulating portion P4. The second insulating portion P2 may be on the peripheral circuit region PR of the substrate 100 and may cover the low-voltage and high-voltage gate patterns 33 and 43 and the blocking pattern 50.

The first insulating portion P1 may be between the ground selection gate electrode 210a of the first stack structure ST1 and the lowermost cell gate electrode 210b of the first stack structure ST1. In addition, the first insulating portion P1 may extend onto the peripheral circuit region PR in order to be connected to the second insulating portion P2.

The third insulating portion P3 may be between the ground selection gate electrode 210a of the second stack structure ST2 and the lowermost cell gate electrode 210b of the second stack structure ST2. In addition, the third insulating portion P3 may extend onto the peripheral circuit region PR in order to be connected to the second insulating portion P2.

The fourth insulating portion P4 may be between the first insulating portion P1 and the third insulating portion P3 on the contact region CR adjacent to the cell array region CAR of the substrate 100. The fourth insulating portion P4 may extend in the second direction Y. The fourth insulating portion P4 may be connected to the first insulating portion P1 and the third insulating portion P3. The fourth insulating portion P4 may be between the ground selection gate electrode 210a of the first stack structure ST1 and the ground selection gate electrode 210a of the second stack structure ST2. Thus, the ground selection gate electrode 210a of the first stack structure ST1 may be isolated from the ground selection gate electrode 210a of the second stack structure ST2 by the fourth insulating portion P4.

Each of connecting electrode portions CEP may be between a pair of cell gate electrodes 210b, which face each other on the contact region CR adjacent to the cell array region CAR in the second direction Y and which are at the same height from the substrate 100. For example, each of the connecting electrode portions CEP may be between each cell gate electrode 210b of the first stack structure ST1 and each cell gate electrode 210b of the second stack structure, which are at the same height from the substrate 100. Each of the connecting electrode portions CEP may extend in the second direction Y in order to be electrically connected to the pair of cell gate electrodes 210b facing each other in the second direction Y. Thus, the cell gate electrodes 210b of the first and second stack structures ST1 and ST2, which are at the same height from the substrate 100, may be in an equipotential state by the connecting electrode portion CEP. In some embodiments, the fourth insulating portion P4 and the connecting electrode portions CEP may vertically overlap each other.

Figure 10:
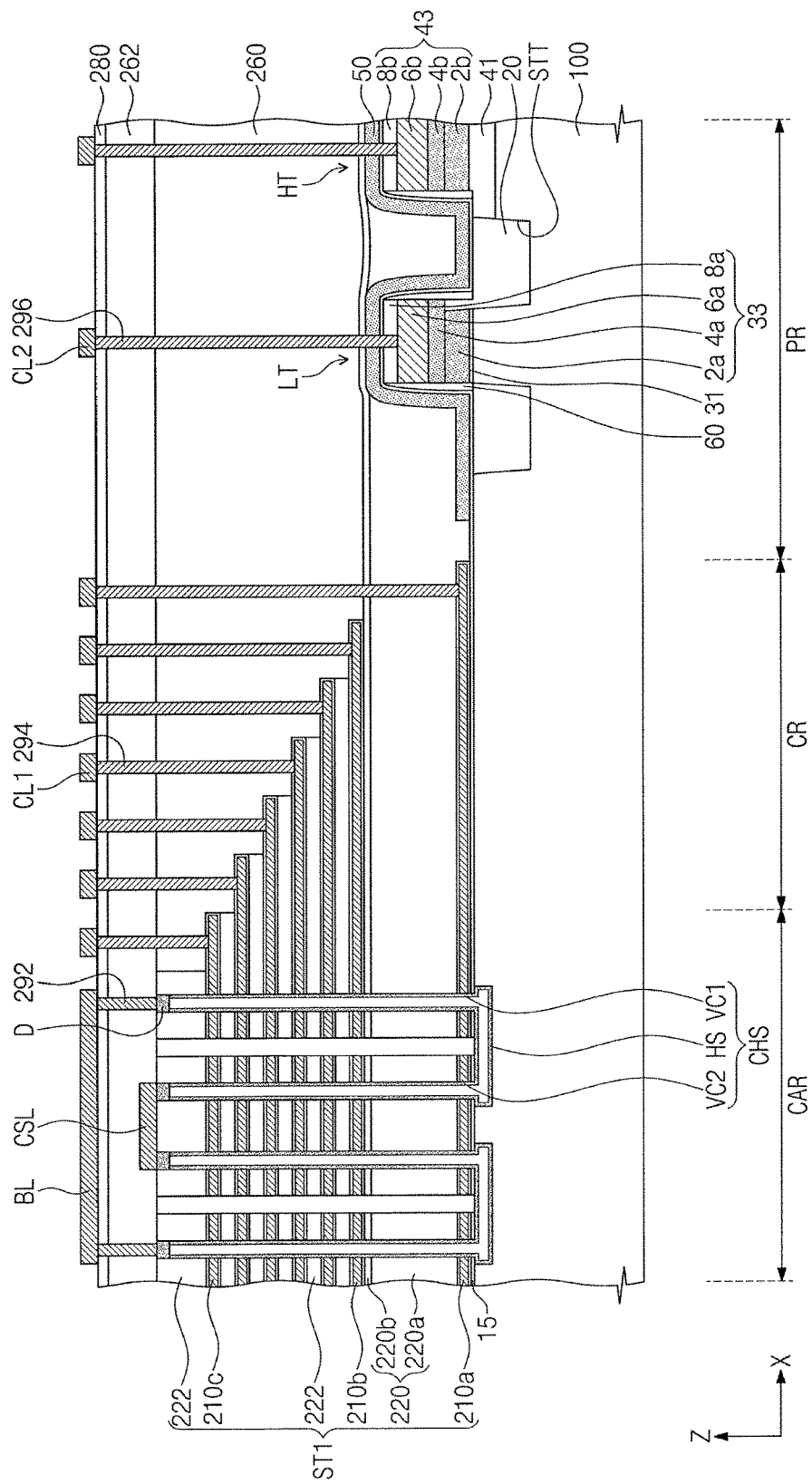
FIG. 10 illustrates another embodiment of a semiconductor memory device.

FIG. 10 is a cross-sectional view illustrating another embodiment of a semiconductor memory device. Referring to FIG. 10, channel structures CHS may penetrate the stack structures ST1 and ST2 on the cell array region CAR of the substrate 100. The channel structures CHS may penetrate the gate electrodes 210a, 210b, and 210c, the insulating patterns 222, and the insulating layer 220.

In some embodiments, each of the channel structures CHS may include first and second vertical channels VC1 and VC2 penetrating the stack structures ST1 and ST2, and a horizontal channel HS under the stack structures ST1 and ST2 to connect the first and second vertical channels VC1 and VC2 to each other. The first and second vertical channels VC1 and VC2 may be in vertical holes penetrating the stack structures ST1 and ST2. The horizontal channel HS may be in a recess region formed in an upper portion of the substrate 100.

In some embodiments, the horizontal channel HS may have a predetermined (e.g., a hollow or macaroni) shape continuously connected to the first and second vertical channels VC1 and VC2. For example, the first and second vertical channels VC1 and VC2 and the horizontal channel HS may have a pipe shape that is formed to have a one body construction. In one embodiment, the first and second vertical channels VC1 and VC2 and the horizontal channel HS may be formed of one semiconductor layer continuously extending without an interface therein. The one semiconductor layer may be formed, for example, of a semiconductor material having a crystal structure including at least one of a single-crystalline structure, an amorphous structure, or a poly-crystalline structure. A charge storage structure may be between the channel structures CHS and the gate electrodes 210a, 210b, and 210c.

According to some embodiments, the first vertical channel VC1 of each of the channel structures CHS may be connected to the bit line BL, and the second vertical channel VC2 of each of the channel structures CHS may be connected to a common source line CSL. The channel structures CHS may be electrically isolated from each other.

FIGS. 11A to 11K are cross-sectional views illustrating various stages of an embodiment of a method for fabricating a semiconductor memory device. The cross-sectional view may be taken along line I-I' in FIG. 2.

Figure 11A:
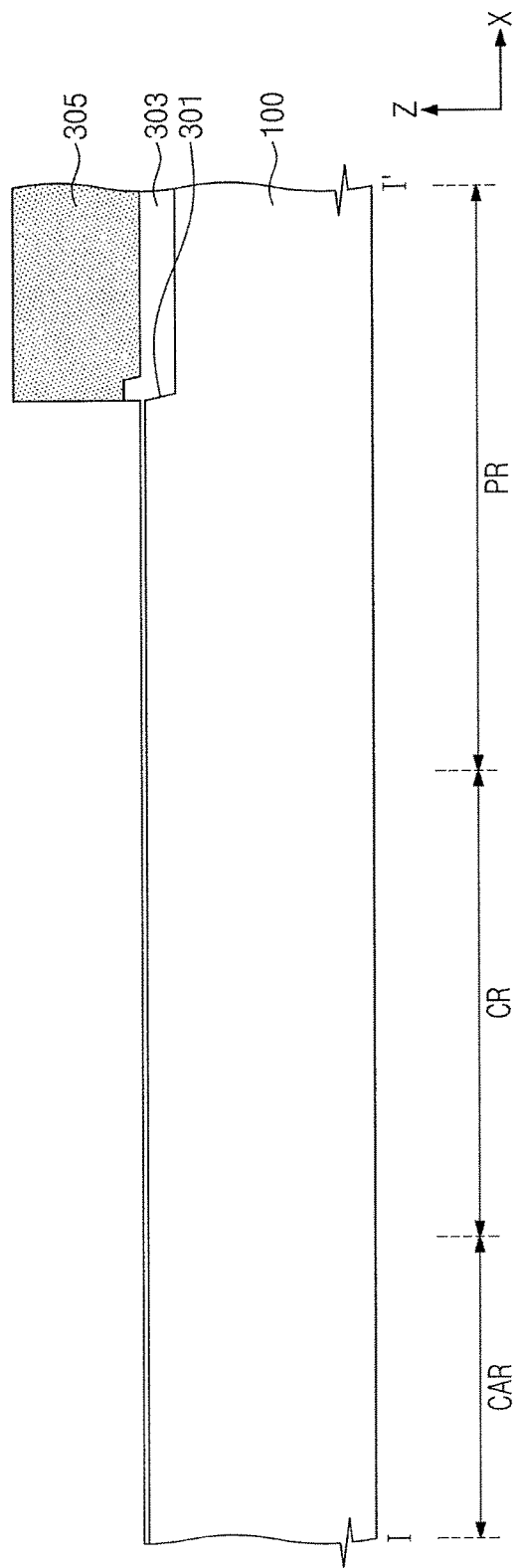
FIGS. 11A to 11K illustrate various stage of an embodiment of a method for fabricating a semiconductor memory device.

Referring to FIG. 11A, a substrate 100 may include a cell array region CAR, a peripheral circuit region PR, and a contact region CR between the cell array region CAR and the peripheral circuit region PR. The substrate 100 may be or include, for example, a silicon substrate, a silicon-germanium substrate, a germanium substrate, or a single-crystalline epitaxial layer grown on a single-crystalline silicon substrate.

A portion of the peripheral circuit region PR of the substrate 100 may be etched to form a trench 301. The portion of the peripheral circuit region PR of the substrate 100, in which the trench 301 is formed, may be a region on which a high-voltage transistor is formed. A gate insulating layer 303 may be formed on the substrate 100. The gate insulating layer 303 may be formed to completely fill the trench 301. The gate insulating layer 303 may include a thermal oxide layer and/or a silicon oxide layer. A first mask pattern 305 may be formed on a portion of the gate insulating layer 303, which is formed on the peripheral circuit region PR of the substrate 100. For example, the first mask pattern 305 may be formed on a portion of the gate insulating layer 303, which fills the trench 301.

The gate insulating layer 303 may be etched using the first mask pattern 305 as an etch mask. Thus, a thickness of a portion, exposed by the first mask pattern 305, of the gate insulating layer 303 may be reduced. The thickness of a portion, covered with the first mask pattern 305, of the gate insulating layer 303 may be greater than the thickness of the portion, exposed by the first mask pattern 305, of the gate insulating layer 303. The portion of the gate insulating layer 303 exposed by the first mask pattern 305 may be etched by a wet etching process. The first mask pattern 305 may be removed after the etching process.

Figure 11B:
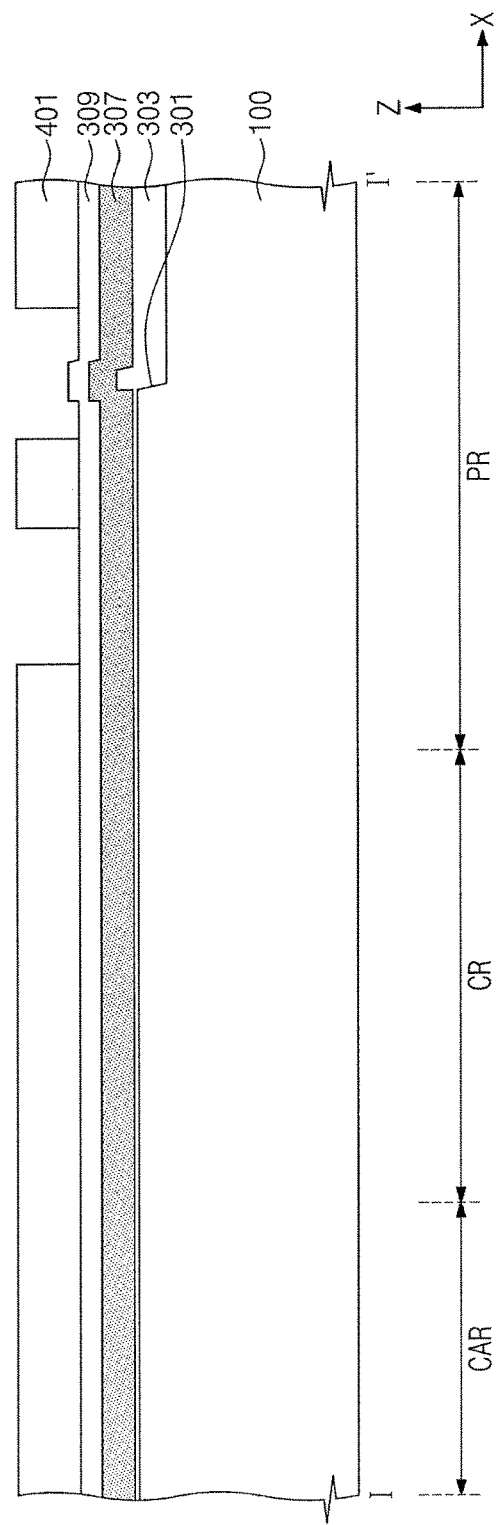

Referring to FIG. 11B, a first conductive layer 307, a first insulating layer 309, and a second mask pattern 401 may be sequentially formed on the gate insulating layer 303. The first conductive layer 307 and the first insulating layer 309 may be formed to have uniform thicknesses. For example, the first conductive layer 307 may include a poly-silicon layer, e.g., a poly-silicon layer doped with dopants. The first insulating layer 309 may include, for example, a silicon oxide layer. The second mask pattern 401 may expose portions of the first insulating layer 309, which are formed on the peripheral circuit region PR of the substrate 100. The second mask pattern 401 may include, for example, silicon nitride and/or silicon oxynitride.

Figure 11C:
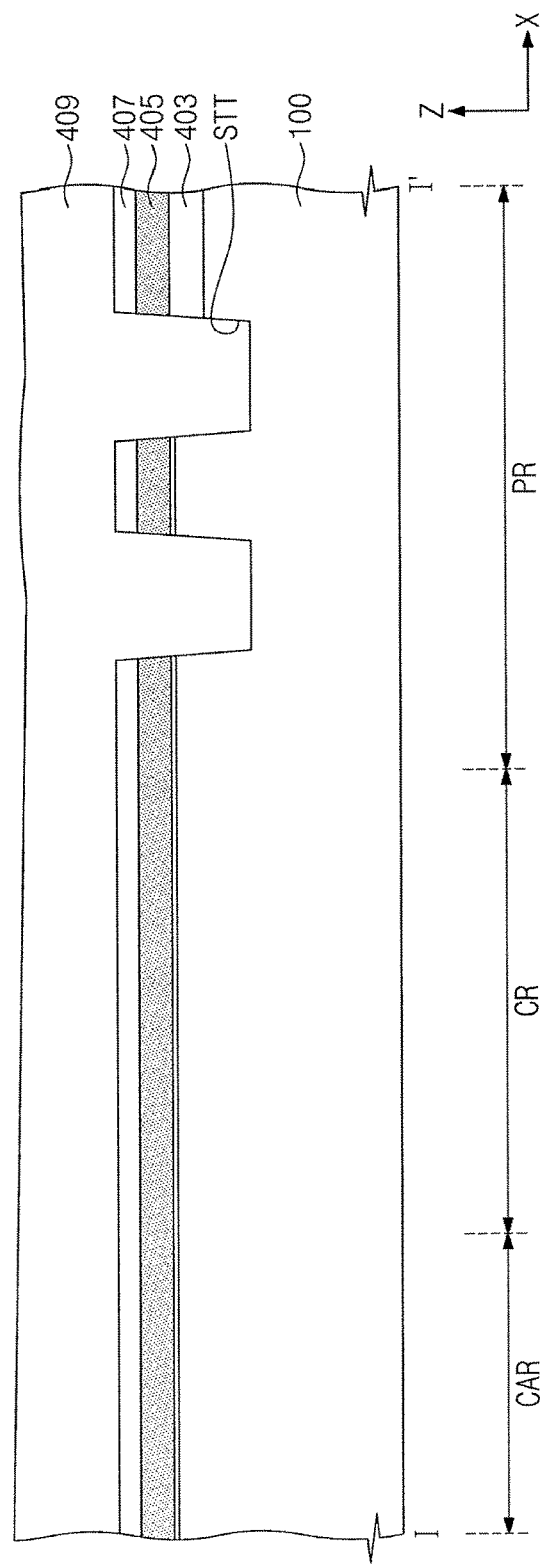

Referring to FIG. 11C, the first insulating layer 309, the first conductive layer 307, the gate insulating layer 303, and the substrate 100 may be sequentially etched using the second mask pattern 401 as an etch mask to form a device isolation trench STT in the peripheral circuit region PR of the substrate 100 and to form preliminary gate insulating patterns 403, preliminary gate patterns 405, and first insulating patterns 407 which are sequentially stacked on the substrate 100.

A second insulating layer 409 may be formed on the first insulating patterns 407. The second insulating layer 409 may be formed to cover the first insulating patterns 407 and to fill the device isolation trench STT.

Figure 11D:
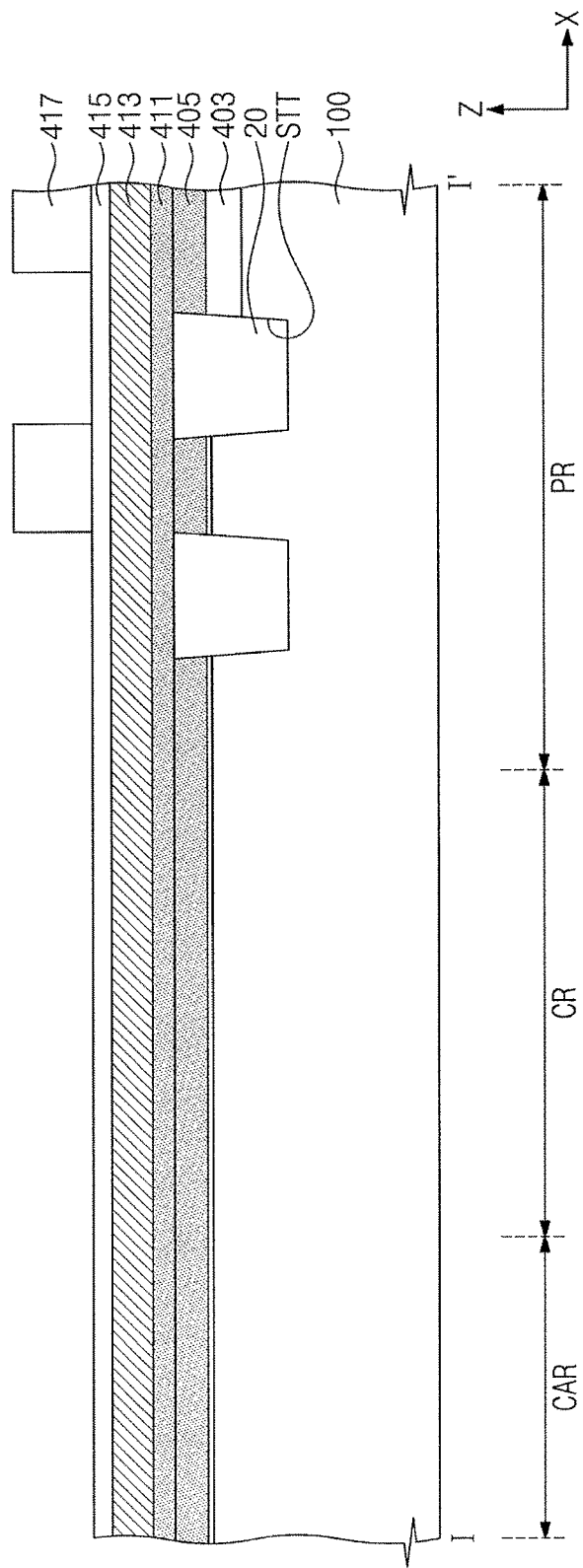

Referring to FIG. 11D, a planarization process may be performed on the second insulating layer 409 and the first insulating patterns 407 until top surfaces of the preliminary gate patterns 405 are exposed. Thus, a device isolation layer 20 may be formed in the device isolation trench STT. For example, the planarization process may be performed using, for example, a chemical mechanical polishing (CMP) process. Since the device isolation layer 20 is faulted, active regions of the substrate 100 may be defined. A second conductive layer 411, a metal layer 413, a capping layer 415, and third mask patterns 417 may be sequentially formed on the preliminary gate patterns 405 of the substrate 100 having the device isolation layer 20. The third mask patterns 417 may be on the peripheral circuit region PR of the substrate 100. The second conductive layer 411 may include, for example, a poly-silicon layer, e.g., a poly-silicon layer doped with dopants. For example, the metal layer 413 may include a metal material (e.g., tungsten) and/or a metal silicide material (e.g., tungsten silicide). The capping layer 415 may include, for example, a silicon oxide layer. For example, the third mask patterns 417 may include, for example, silicon nitride and/or silicon oxynitride.

Figure 11E:
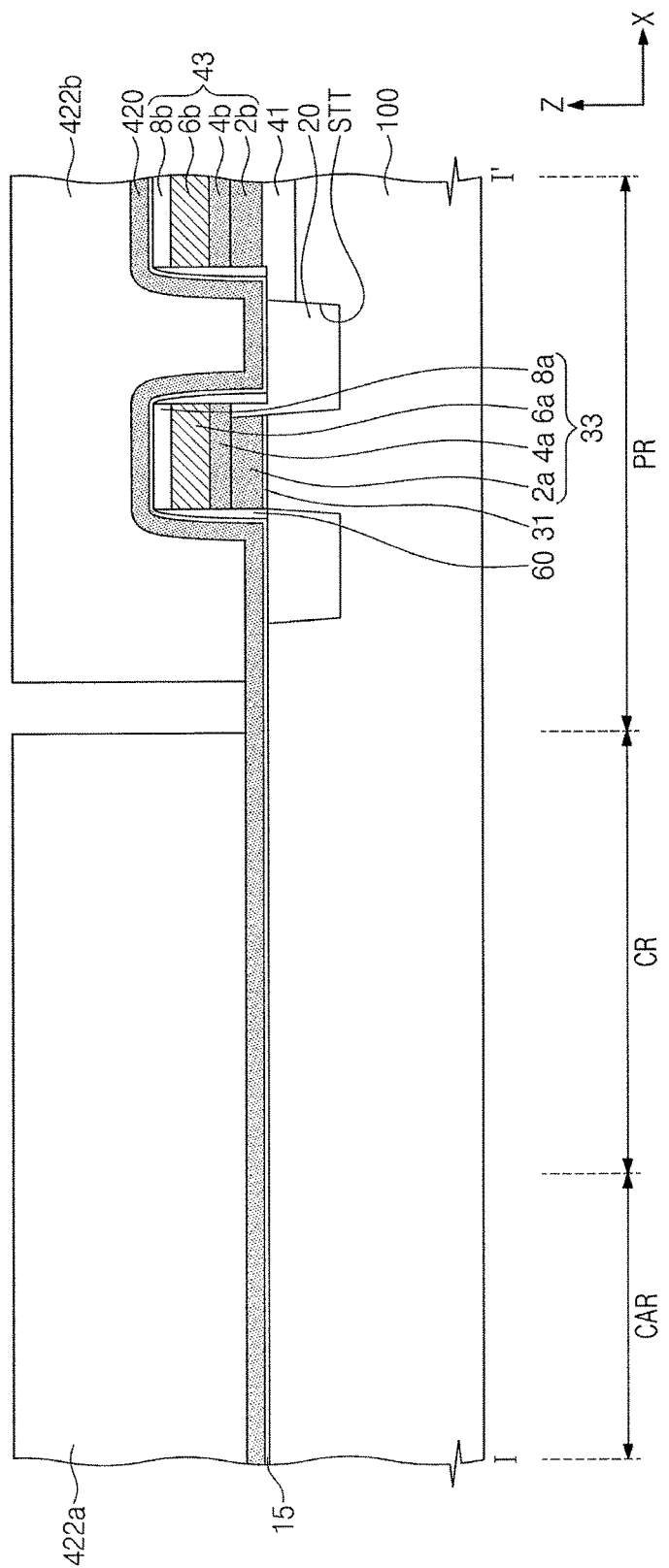

Referring to FIG. 11E, the capping layer 415, the metal layer 413, the second conductive layer 411, the preliminary gate patterns 405, the device isolation layer 20, and the preliminary gate insulating patterns 403 may be etched using the third mask patterns 417 as etch masks. Thus, a low-voltage gate insulating pattern 31, a low-voltage gate pattern 33, a high-voltage gate insulating pattern 41, and a high-voltage gate pattern 43 may be formed on the peripheral circuit region PR of the substrate 100. The low-voltage and high-voltage gate insulating patterns 31 and 41 may be formed on the active regions of the substrate 100, respectively. The low-voltage gate insulating pattern 31 may be thinner than the high-voltage gate insulating pattern 41. The low-voltage gate pattern 33 may be formed on the low-voltage gate insulating pattern 31. The low-voltage gate pattern 33 may include a first poly-silicon pattern 2a, a second poly-silicon pattern 4a, a metal pattern 6a, and a capping pattern 8a sequentially formed on the low-voltage gate insulating pattern 31.

The high-voltage gate pattern 43 may be formed on the high-voltage gate insulating pattern 41. The high-voltage gate pattern 43 may include a first poly-silicon pattern 2b, a second poly-silicon pattern 4b, a metal pattern 6b, and a capping pattern 8b sequentially formed on the high-voltage gate insulating pattern 41. The top surface of the substrate 100 of the cell array region CAR and the contact region CR may be exposed by the etching process for forming the gate insulating patterns 31 and 41 and the gate patterns 33 and 43.

Low-voltage and high-voltage source/drain regions SD1 and SD2 may be formed in the peripheral circuit region PR of the substrate 100. The low-voltage source/drain regions SD1 may be formed in the active region of the substrate 100 at different sides of the low-voltage gate pattern 33. The high-voltage source/drain regions SD2 may be formed in the active region of the substrate 100 at different sides of the high-voltage gate pattern 43. Dopants may be implanted into the active regions of the substrate 100 by an ion implantation process, thereby forming the low-voltage and high-voltage source/drain regions SD1 and SD2. Spacers 60 may be formed on sidewalls of the low-voltage and high-voltage gate patterns 33 and 43.

In some embodiments, an insulating layer may be formed to cover the top surface of the substrate 100 and surfaces of the low-voltage and high-voltage gate patterns 33 and 43. An etching process (e.g., an etch-back process) may be performed on the insulating layer to form the spacers 60. A buffer layer 15 may be formed to conformally cover top surfaces of the low-voltage and high-voltage gate patterns 33 and 43, sidewalls of the spacers 60, and the top surface of the substrate 100. For example, the buffer layer 15 may include a silicon oxide layer or a thermal oxide layer.

A blocking layer 420 may be formed on the buffer layer 15. In one embodiment, the blocking layer 420 may be formed on the cell array region CAR, the contact region CR, and the peripheral circuit region PR of the substrate 100. The blocking layer 420 may have the same thickness as a sacrificial layer 440 of FIG. 11H and may be formed using the same material and the same deposition process as the sacrificial layer 440 of FIG. 11H. The blocking layer 420 may include, for example, a silicon nitride layer, may be formed by a chemical vapor deposition (CVD) process.

Fourth and fifth mask patterns 422a and 422b may be formed on the blocking layer 420. The fourth mask pattern 422a may be formed on the cell array region CAR and the contact region CR of the substrate 100. The fifth mask pattern 422b may be formed on the peripheral circuit region PR of the substrate 100. A portion of the blocking layer 420 between the contact region CR and the peripheral circuit region PR may be exposed by the fourth and fifth mask patterns 422a and 422b. The fourth mask pattern 422a may include an opening to expose another portion of the blocking layer 420 on the contact region CR adjacent to the cell array region CAR of the substrate 100.

Figure 11F:
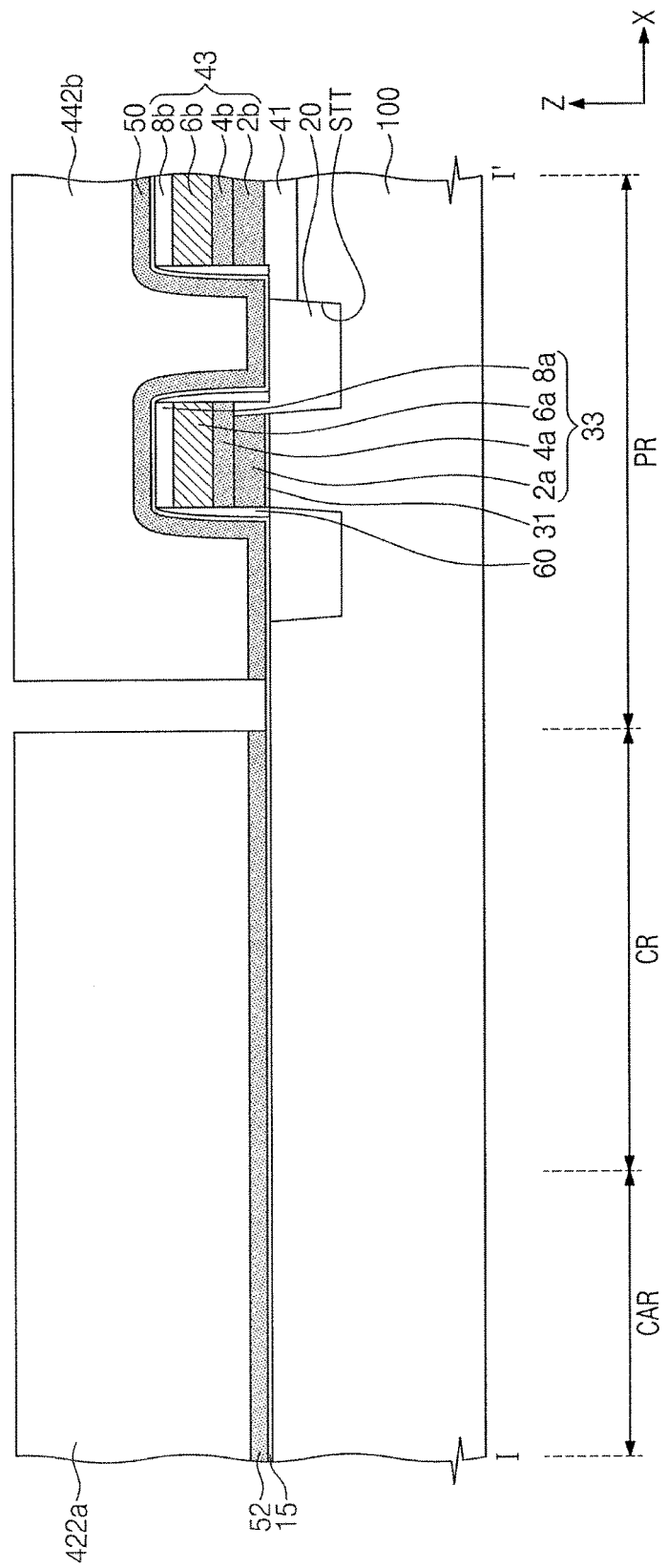

Referring to FIG. 11F, the blocking layer 420 may be etched using the fourth and fifth mask patterns 422a and 422b as etch masks. Thus, a sacrificial pattern 52 may be formed on the cell array region CAR and the contact region CR of the substrate 100. A blocking pattern 50 may be formed on the peripheral circuit region PR of the substrate 100. The blocking pattern 50 may be a protection pattern that prevents hydrogen from being injected into the low-voltage and high-voltage gate patterns 33 and 43 during a process for forming an interlayer insulating pattern 260 on the blocking pattern 50.

In some embodiments, the sacrificial pattern 52 may include a hole formed by etching the blocking layer 420 exposed by the opening. The hole may be between the ground selection gate electrode 210a of the first stack structure ST1 and the ground selection gate electrode 210a of the second stack structure ST2 in FIG. 9A. In the embodiment of FIGS. 8 and 9A, the hole may be formed to electrically isolate the ground selection gate electrode 210a of the first stack structure ST1 from the ground selection gate electrode 210a of the second stack structure ST2. After the etching process, the fourth and fifth mask patterns 422a and 422b may be removed to expose top surfaces of the sacrificial pattern 52 and the blocking pattern 50.

Figure 11G:
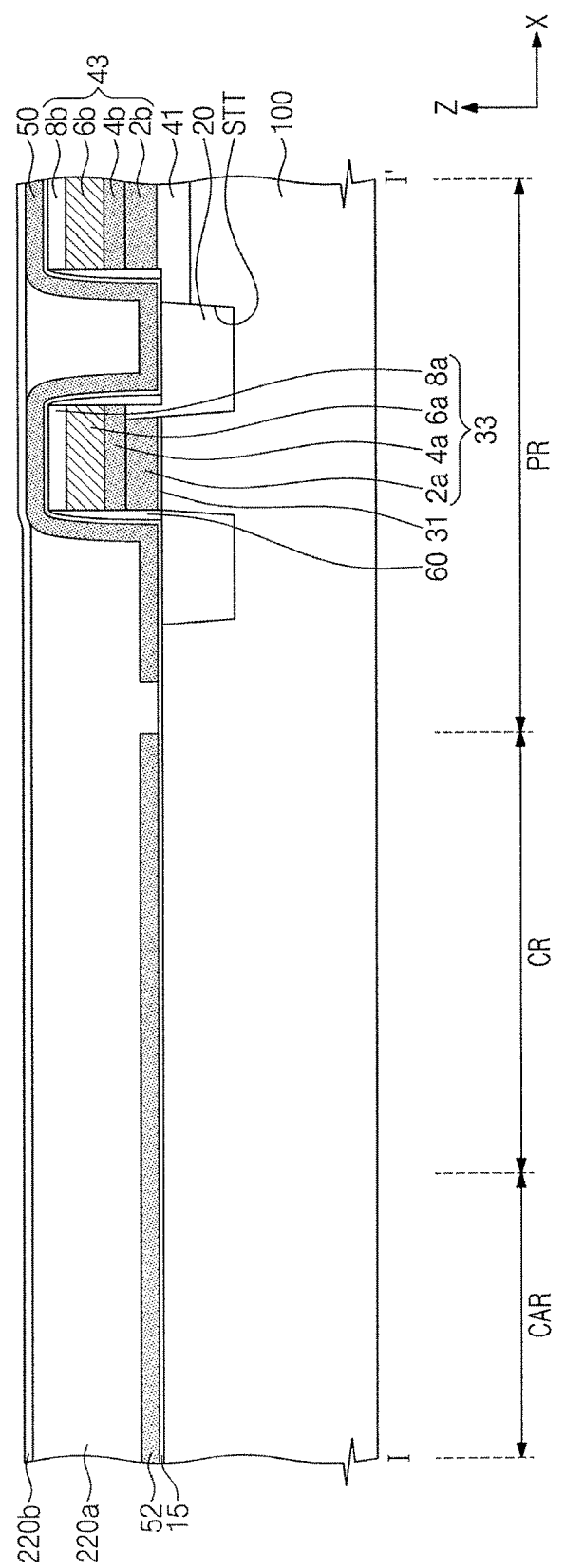

Referring to FIG. 11G, a first insulating layer 220a may be formed on the sacrificial pattern 52 and the blocking pattern 50. The first insulating layer 220a may cover the sacrificial pattern 52 and the blocking pattern 50 and may fill a space between the sacrificial pattern 52 and the blocking pattern 50. In some embodiments, the first insulating layer 220a may fill the hole of the sacrificial pattern 52. The first insulating layer 220a may include, for example, a high-density plasma (HDP) oxide layer.

An etching process may be performed on the first insulating layer 220a to lower a height of the first insulating layer 220a from the substrate 100. The etching process may be performed using, for example, a chemical mechanical polishing (CMP) process and/or an etch-back process. Thus, the top surface of the blocking pattern 50 may be exposed. More particularly, the top surface of the blocking pattern 50 disposed on the top surfaces of the low-voltage and high-voltage gate patterns 33 and 43 may be exposed. The top surface of the first insulating layer 220a may be at the same level as or a lower level than the top surface of the blocking pattern 50 (e.g., the top surface of the blocking pattern 50 on the top surfaces of the gate patterns 33 and 43).

A second insulating layer 220a may be formed on the first insulating layer 220a. The second insulating layer 220b may have a predetermined thin thickness and may cover the top surface of the blocking pattern 50 exposed by the first insulating layer 220a. The second insulating layer 220b may be formed of the same material as the first insulating layer 220a, e.g., a HDP oxide layer.

According to some embodiments, at least a portion of the high-voltage gate insulating pattern 41 having a predetermined thick thickness may be formed in the substrate 100. Thus, heights of the low-voltage and high-voltage gate patterns 33 and 43 from the substrate 100 may be reduced. Also, the blocking pattern 50 may be formed together with the sacrificial pattern 52, to be replaced with a ground selection gate electrode 210a in a subsequent process. In addition, the first and second insulating layers 220a and 220b covering the gate patterns 33 and 43 may be continuously formed. The first and second insulating layers 220a and 220b may be formed between the sacrificial pattern 52 and the lowermost sacrificial layer 440 formed in a subsequent process. Thus, fabricating processes of the semiconductor memory device may be simplified.

Figure 11H:
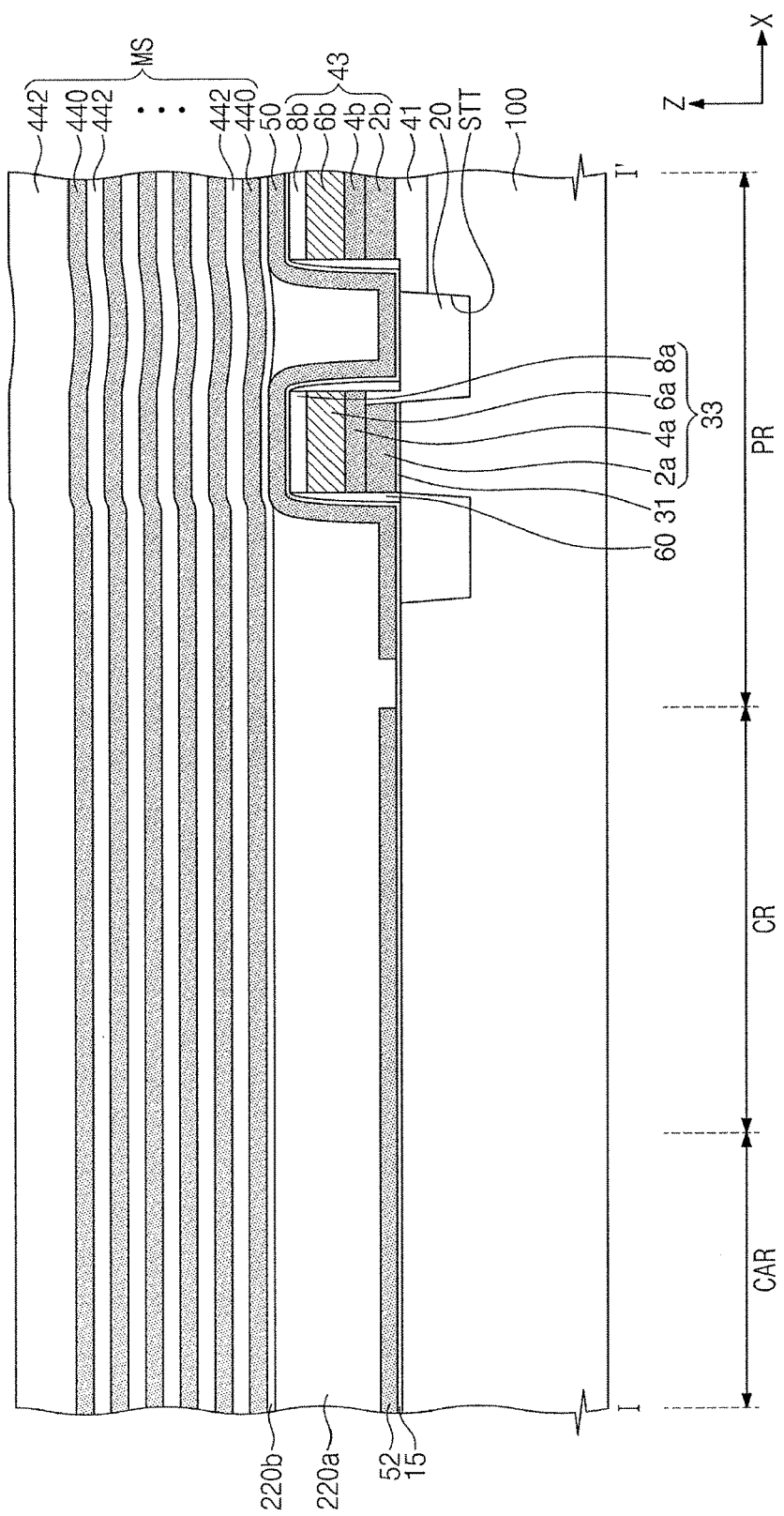

Referring to FIG. 11H, a mold structure MS may be formed on the second insulating layer 220b. The mold structure MS may include sacrificial layers 440 and insulating layers 442 which are alternately formed on the second insulating layer 220b. The sacrificial layers 440 may be formed using the same material and the same process as the sacrificial pattern 52 and the blocking pattern 50. Each of the sacrificial layers 440 may include, for example, a silicon nitride layer. The sacrificial layers 440 may be formed, for example, by a CVD process. The insulating layers 442 may be formed of a material having an etch selectivity with respect to the sacrificial layers 440. Each of the insulating layers 442 may include, for example, a silicon oxide layer.

Figure 11I:
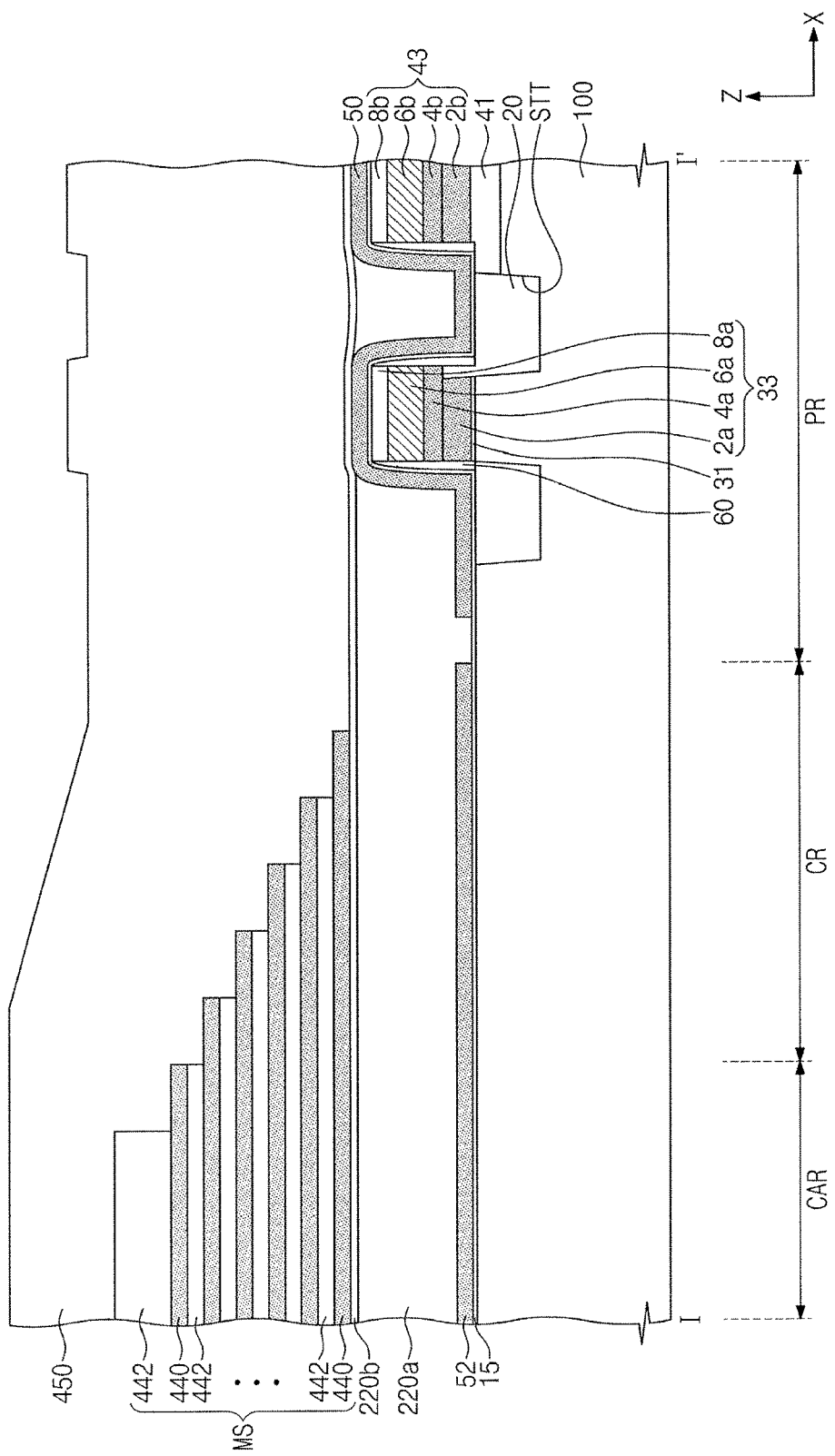

Referring to FIG. 11I, the mold structure MS may be patterned to have a staircase structure on the contact region CR. In one embodiment, the mold structure MS may include an end portion having the staircase structure. The mold structure MS may be formed on the cell array region CAR and the contact region CR of the substrate 100. The second insulating layer 220b on the peripheral circuit region PR may be exposed. Patterning the mold structure MS may include forming a mask pattern exposing a portion of the uppermost insulating layer 442 of the peripheral circuit region PR on the mold structure MS, etching the insulating layers 442 and the sacrificial layers 440 by using the mask pattern as an etch mask, and reducing a width of the mask pattern to increase exposed planar areas of the insulating and sacrificial layers 442 and 440 to be etched.

At this time, etching of the insulating and sacrificial layers 442 and 440 and reducing of the width of the mold structure may be alternately repeated. Top surfaces of end portions of the sacrificial layers 440 may be exposed on the contact region CR of the substrate 100. The length of the lowermost sacrificial layer 440 in the first direction X may be less than the length of the sacrificial pattern 52 in the first direction X. Lengths of the sacrificial layers 440 in the first direction X may decrease sequentially as a vertical distance from the substrate 100 increases. Likewise, lengths of the insulating layers 442 in the first direction X may decrease sequentially as a vertical distance from the substrate 100 increases. The length, in the first direction X, of each of the insulating layers 442 may be equal to the length, in the first direction X, of the sacrificial layer 442 disposed directly on each of the insulating layers 442.

An interlayer insulating layer 450 may be formed on the mold structure MS and the second insulating layer 220b. The interlayer insulating layer 450 may cover the uppermost insulating layer 442 formed on the cell array region CAR of the substrate 100, the end portion of the mold structure MS, and the second insulating layer 220b. The interlayer insulating layer 450 may include, for example, a tetraethyl orthosilicate (TEOS) oxide layer.

Figure 11J:
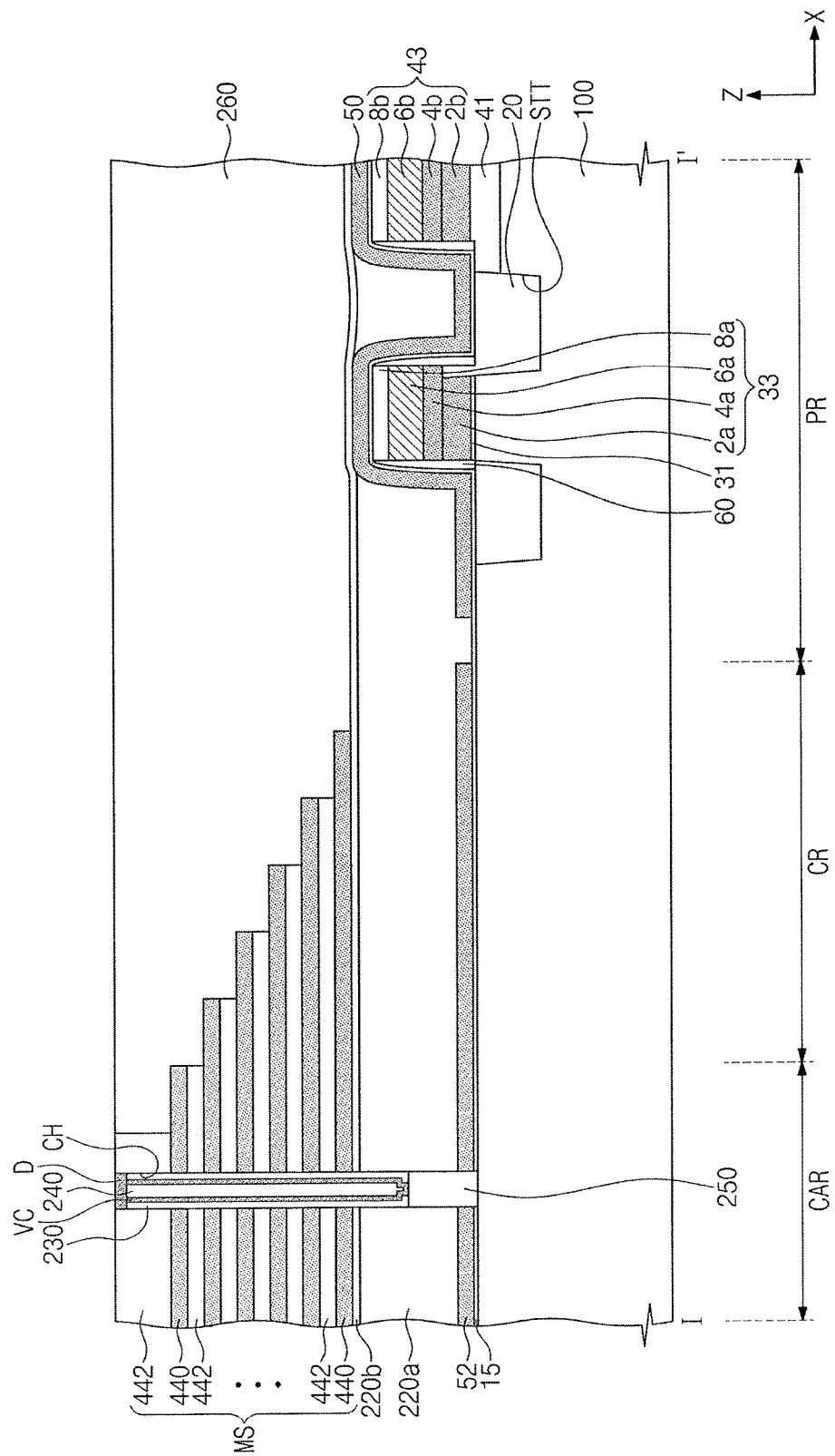

Referring to FIG. 11J, the interlayer insulating layer 450 may be etched to form an interlayer insulating pattern 260. To reduce a height difference between a top surface of the interlayer insulating layer 450 formed on the peripheral circuit region PR and the top surface of the interlayer insulating layer 450 formed on the cell array region CAR and the contact region CR, an upper portion of the interlayer insulating layer 450 of the cell array region CAR and the contact region CR may be etched and then a planarization process may be performed on the interlayer insulating layer 450 until the top surface of the uppermost insulating layer 442 is exposed. Thus, the interlayer insulating pattern 260 may be formed.

The mold structure MS and the buffer layer 15 may be patterned to form channel holes CH exposing the substrate 100. In some embodiments, a mask pattern may be formed on the uppermost insulating layer 442 and the interlayer insulating pattern 260. The mold structure MS and the buffer layer 15 may be anisotropically etched using the mask pattern as an etch mask to form the channel holes CH. The top surface of the substrate 100 exposed through the channel holes CH may be recessed by over-etching. Each of the channel holes CH has a predetermined shape, e.g., a circular shape, an elliptical shape, or a polygonal shape, when viewed from a plan view.

A semiconductor pillar 250 may be formed in each of the channel holes CH. The semiconductor pillar 250 may be grown from the substrate 100 by performing a selective epitaxial growth (SEG) process using the substrate 100, exposed through the channel hole CH, as a seed. The semiconductor pillar 250 may include a material having the same orientation as substrate 100. The semiconductor pillar 250 may include, for example, an intrinsic semiconductor material or P-type semiconductor material.

A charge storage structure 230 may be formed on a sidewall of the channel hole CH. The charge storage structure 230 may cover the sidewall of the channel hole CH and may cover a portion of a top surface of the semiconductor pillar 250 exposed by the channel hole CH.

Referring to FIG. 6, the charge storage structure 230 may include a blocking insulating layer BLL, a charge storage layer CTL, and a tunnel insulating layer TL sequentially formed on the sidewall of the channel hole CH. For example, the blocking insulating layer BLL may include a silicon oxide layer or a high-k dielectric layer (e.g., $Al_2O_3$ or $HfO_2$), the charge storage layer CTL may include a silicon nitride layer. The tunnel insulating layer TL may include a silicon oxide layer or a high-k dielectric layer (e.g., $Al_2O_3$ or $HfO_2$).

A vertical channel portion VC may be formed in the channel hole CH in which the charge storage structure 230 is formed. The vertical channel portion VC may conformally cover an inner sidewall of the charge storage structure 230 and the top surface of the semiconductor pillar 250 exposed by the charge storage structure 230. The vertical channel portion VC may include, for example, a semiconductor material. For example, the vertical channel portion VC may include at least one of a poly-crystalline silicon layer, an organic semiconductor layer, or a carbon nano-structure.

A gap-fill layer 240 may be formed in an inner space surrounded by the vertical channel portion VC. The gap-fill layer 240 may completely fill the inner space. The gap-fill layer 240 may be formed, for example, using a spin-on-glass (SOG) technique. The gap-fill layer 240 may include an insulating material, e.g., a silicon oxide layer or a silicon nitride layer. Before formation of the gap-fill layer 240, the vertical channel portion VC may be thermally treated by a hydrogen annealing process performed under a gas atmosphere including hydrogen or heavy hydrogen. Crystal defects existing in the vertical channel portion VC may be cured by the hydrogen annealing process.

A pad D may be formed on the vertical channel portion VC, the charge storage structure 230, and the gap-fill layer 240. In some embodiments, upper portions of the charge storage structure 230, the vertical channel portion VC, and the gap-fill layer 240 may be etched to form a recess region. The pad D may be formed by filling the recess region with a conductive material. In certain embodiments, the pad D may be formed by doping an upper portion of the vertical channel portion VC with dopants having a different conductivity type from the vertical channel portion VC.

Figure 11K:
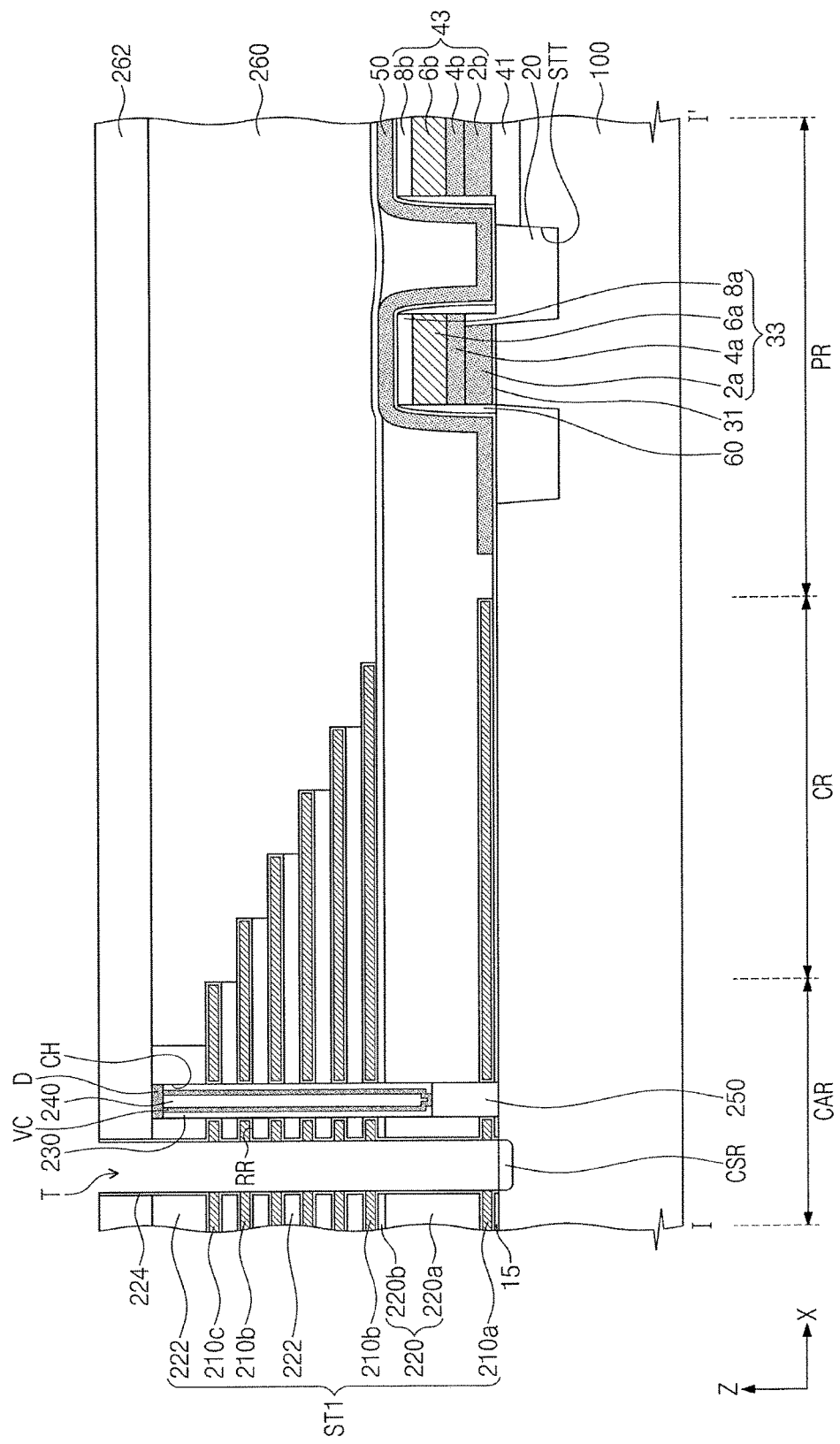

Referring to FIG. 11K, an anisotropic etching process may be performed on the mold structure MS to form a common source trench T. In some embodiments, a first interlayer insulating layer 262 may be formed on the mold structure MS, and the first interlayer insulating layer 262 and the mold structure MS may be patterned until the top surface of the substrate 100 is exposed, thereby forming the common source trench T. The common source trench T may extend in the first direction X. Thus, the common source trench T may have, for example, a linear or rectangular shape extending in the first direction X.

First and second stack structures ST1 and ST2 spaced apart from each other in the second direction Y may be formed on substrate 100 by formation of the common source trench T. Each of the first and second stack structures ST1 and ST2 may include a patterned sacrificial pattern 52, patterned first and second insulating layers 220a and 220b, patterned sacrificial layers 440, and insulating patterns 222. Sidewalls of the first and second stack structures ST1 and ST2 may be exposed by common source trench T.

The patterned sacrificial pattern 52 and the patterned sacrificial layers 440 exposed through the common source trench T may be removed to form recess regions RR. The patterned sacrificial pattern 52 and the patterned sacrificial layers 440 may be removed by performing a wet etching process and/or an isotropic dry etching process. The recess regions RR may be formed between the insulating patterns 222, between the lowermost insulating pattern 222 and the second insulating layer 220b, and between the first insulating layer 220a and the buffer layer 15.

In some embodiments, the insulating patterns 222 and the first and second insulating layers 220a and 220b may be partially etched through the recess regions RR by the etching process of forming the recess regions RR. Thus, the minimum heights of the recess regions RR may be greater than the minimum thickness of the blocking pattern 50. The minimum heights of the recess regions RR may correspond, for example, to the minimum distance between the buffer layer 15 and the first insulating layer 220a adjacent to each other in the third direction Z, the minimum distance between the second insulating layer 220b and the lowermost insulating pattern 222 adjacent to each other in the third direction Z, and the minimum distance between the insulating patterns 222 adjacent to each other in the third direction Z. The etching process may be performed using an etching solution including phosphoric acid.

The recess regions RR may laterally extend from the common source trench T into between the insulating patterns 222. Top and bottom surfaces of the insulating patterns 222 and portions of an outer sidewall of the charge storage structure 230 may be exposed through the recess regions RR.

A horizontal insulating layer 224 may be formed in the recess regions RR. For example, the horizontal insulating layer 224 may conformally cover surfaces of the insulating patterns 222, the outer sidewall of the charge storage structure 230, and a sidewall of the first interlayer insulating layer 262. The horizontal insulating layer 224 may be formed using a deposition process having an excellent step coverage property. For example, the horizontal insulating layer 224 may be formed using a CVD process or an atomic layer deposition (ALD) process. In some embodiments, the horizontal insulating layer 224 may include at least one of a silicon oxide layer (e.g., $SiO_2$) or a high-k dielectric layer (e.g., aluminum oxide ($Al_2O_3$) or hafnium oxide ($HfO_2$)).

A ground selection gate electrode 210a, cell gate electrodes 210b, and a string selection gate electrode 210c may be locally formed in the recess regions RR, respectively. In some embodiments, a metal layer may be formed to fill the common source trench T and the recess regions RR. The metal layer formed in the common source trench T may be removed to form the ground selection gate electrode 210a, the cell gate electrodes 210b, and the string selection gate electrode 210c. A cell dopant region CSR may be formed in the substrate 100 exposed through the common source trench T. The cell dopant region CSR may be formed using an ion implantation process. The cell dopant region CSR may have a different conductivity type from substrate 100.

Referring again to FIG. 2, a contact structure 270 may be formed in the common source trench T. The contact structure 270 may include a spacer 271 and a common source contact 272. The spacer 271 may cover sidewalls of the common source trench T. The common source contact 272 may be formed to fill a remaining space of the common source trench T having the spacer 271. The spacer 271 may include, for example, at least one of a silicon oxide layer or a silicon nitride layer. The common source contact 272 may include, for example, at least one of a metal (e.g., tungsten, copper, or aluminum), a conductive metal nitride (e.g., titanium nitride or tantalum nitride), or a transition metal (e.g., titanium or tantalum).

A second interlayer insulating layer 280 may be formed on the first interlayer insulating layer 262. The second interlayer insulating layer 280 may cover top surfaces of the first interlayer insulating layer 262 and the contact structure 270. The second interlayer insulating layer 280 may include, for example, a silicon oxide layer. A bit line contact plug 292 may be formed on the pad D. Cell contact plugs 294 may be formed on an end portion of the ground selection gate electrode 210a, end portions of the cell gate electrodes 210b, and an end portion of string selection gate electrode 210c, respectively. Gate contact plugs 296 may be formed on the low-voltage gate pattern 33 and the high-voltage gate pattern 43, respectively. Source/drain contact plugs 298 may be formed on the low-voltage and high-voltage source/drain regions SD1 and SD2, respectively. The contact plugs 292, 294, 296, and 298 may include, for example, a metal layer and a metal silicide layer.

A bit line BL, first interconnection lines CL1, and second interconnection lines CL2 may be formed on the second interlayer insulating layer 280. The bit line BL may be electrically connected to the bit line contact plug 292, the first interconnection lines CL1 may be electrically connected to the cell contact plugs 294, and the second interconnection lines CL2 may be electrically connected to the gate contact plugs 296.

According to one or more of the aforementioned embodiments, the top surfaces of the high-voltage and low-voltage gate patterns on the peripheral circuit region may be at a lower level than the top surface of the insulating layer between the ground selection line and the lowermost word line. Thus, the sacrificial pattern replaced with the ground selection line may be formed together with the blocking pattern formed on the high-voltage and low-voltage gate patterns. In addition, the insulating layer on at least sidewalls of the high-voltage and low-voltage gate patterns may be formed simultaneously with the insulating layer between the ground selection line and the lowermost word line. As a result, fabricating processes of the semiconductor memory device may be simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A semiconductor memory device, comprising:
a substrate including a cell array region and a peripheral circuit region;
a ground selection line on the cell array region of the substrate;
a word line on the ground selection line;
an insulating layer between the ground selection line and the word line;
a vertical channel portion penetrating the ground selection line, the word line, and the insulating layer in a direction vertical to a top surface of the substrate; and
a first peripheral circuit gate pattern on the peripheral circuit region of the substrate, wherein the insulating layer extends continuously from between the ground selection line and the word line in the cell array region onto the peripheral circuit region to cover a top surface of the first peripheral circuit gate pattern.

2. The device as claimed in claim 1, further comprising:
a first gate insulating pattern between the first peripheral circuit gate pattern and the substrate, wherein a bottom surface of the first gate insulating pattern is lower than the top surface of the substrate of the cell array region.

3. The device as claimed in claim 2, further comprising:
a second peripheral circuit gate pattern on the peripheral circuit region of the substrate; and
a second gate insulating pattern between the second peripheral circuit gate pattern and the substrate, wherein a thickness of the first gate insulating pattern is greater than a thickness of the second gate insulating pattern, and wherein a top surface of the first gate insulating pattern is at substantially a same level as a top surface of the second gate insulating pattern.

4. The device as claimed in claim 1, further comprising:
a blocking pattern extending from between the insulating layer and the top surface of the first peripheral circuit gate pattern into between the insulating layer and the substrate, a lowermost surface of the blocking pattern being level with a lowermost surface of the ground selection line.

5. The device as claimed in claim 4, wherein the blocking pattern includes a different insulating material from the insulating layer.

6. The device as claimed in claim 4, wherein the blocking pattern includes:
a first portion on the top surface of the first peripheral circuit gate pattern; and
a second portion on a sidewall of the first peripheral circuit gate pattern,
wherein a minimum thickness of the first portion is greater than a minimum thickness of the second portion.

7. The device as claimed in claim 4, wherein the insulating layer is between the ground selection line and the blocking pattern.

8. The device as claimed in claim 4, further comprising:
a buffer layer between the substrate and the ground selection line,
wherein the buffer layer extends between the insulating layer and the substrate, between the substrate and the blocking pattern, and between the blocking pattern and the first peripheral circuit gate pattern.

9. The device as claimed in claim 8, wherein the insulating layer is in contact with a top surface of the buffer layer between the ground selection line and the blocking pattern.

10. The device as claimed in claim 1, wherein the top surface of the first peripheral circuit gate pattern is at a level between the ground selection line and the word line.

11. A semiconductor memory device, comprising:
a substrate including a cell array region, a peripheral circuit region, and a contact region between the cell array region and the peripheral circuit region;
a first stack structure on the cell array region and the contact region of the substrate, the first stack structure extending in a first direction and including a first ground selection line, a first word line, and a first insulating portion between the first ground selection line and the first word line;
a vertical channel portion penetrating the first stack structure on the cell array region in a direction vertical to a top surface of the substrate;
a peripheral circuit gate pattern on the peripheral circuit region of the substrate; and
a second insulating portion covering a top surface of the peripheral circuit gate pattern, wherein a top surface of the second insulating portion is lower than a top surface of the first word line, and wherein the first insulating portion extends continuously onto the peripheral circuit region and is connected to the second insulating portion.

12. The device as claimed in claim 11, further comprising:
a second stack structure on the cell array region and the contact region of the substrate, the second stack structure spaced apart from the first stack structure in a second direction intersecting the first direction, wherein:
the second stack structure includes a second ground selection line, a second word line, and a third insulating portion between the second ground selection line and the second word line, the third insulating portion extends onto the peripheral circuit region so as to be connected to the second insulating portion, and the first insulating portion and the third insulating portion extend in the first direction in parallel to each other.

13. The device as claimed in claim 12, further comprising:
a fourth insulating portion between the first insulating portion and the third insulating portion on the contact region of the substrate, wherein the fourth insulating portion extends in the second direction so as to be connected to the first insulating portion and the third insulating portion.

14. The device as claimed in claim 13, wherein the fourth insulating portion extends between the first ground selection line and the second ground selection line.

15. The device as claimed in claim 11, wherein a top surface of the first insulating portion is at a lower level than or at a substantially a same level as the top surface of the second insulating portion, the first and second insulating portions being parts of a same and continuous insulating layer.

16. A semiconductor memory device, comprising:
a cell region;
a peripheral circuit region;
a plurality of word lines stacked in the cell region;
a ground selection line in the cell region;
a first transistor in the peripheral circuit region; and
an insulating layer between the ground selection line and a lowermost word line of the plurality of word lines, the insulating layer being a continuous insulating layer extending from between the ground selection line and the lowermost word line of the plurality of word lines into the peripheral circuit region,
wherein a top layer of the first transistor is at a height lower than the lowermost word line of the plurality of word lines, the continuous insulating layer overlapping a topmost surface of the top layer of the first transistor.

17. The device as claimed in claim 16, further comprising:
a second transistor in the peripheral circuit region,
wherein a top layer of the second transistor is at a height equal to or lower than the lowermost one of the word lines.

18. The device as claimed in claim 17, wherein:
the first transistor is a low-voltage transistor, and
the second transistor is a high-voltage transistor.

19. The device as claimed in claim 16, wherein the continuous insulating layer between the ground selection line and the lowermost word line of the plurality of word lines overlaps a majority of a lateral side of the first transistor.

20. The device as claimed in claim 16, further comprising a blocking pattern conformally covering the topmost surface and lateral side of the first transistor, a lowermost surface of the blocking pattern being level with a lowermost surface of the ground selection line.

* * * * *